United States Patent
Wang et al.

(10) Patent No.: US 12,374,403 B2
(45) Date of Patent: Jul. 29, 2025

(54) OPTIMIZED READ CURRENT CONSUMPTION BASED ON LOWER PAGE READ INFORMATION FOR NON-VOLATILE MEMORY APPARATUS

(71) Applicant: Western Digital Technologies, Inc., San Jose, CA (US)

(72) Inventors: Panni Wang, San Jose, CA (US); Xiaojia Jia, San Jose, CA (US); Swaroop Kaza, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 202 days.

(21) Appl. No.: 18/229,748

(22) Filed: Aug. 3, 2023

(65) Prior Publication Data
US 2024/0420771 A1    Dec. 19, 2024

Related U.S. Application Data

(60) Provisional application No. 63/472,663, filed on Jun. 13, 2023.

(51) Int. Cl.
| | |
|---|---|
| *G11C 7/00* | (2006.01) |
| *G11C 16/10* | (2006.01) |
| *G11C 16/24* | (2006.01) |
| *G11C 16/26* | (2006.01) |

(52) U.S. Cl.
CPC ............ *G11C 16/102* (2013.01); *G11C 16/24* (2013.01); *G11C 16/26* (2013.01)

(58) Field of Classification Search
CPC ....... G11C 7/1051; G11C 7/22; G11C 7/1072; G11C 7/1066
USPC ...................................... 365/189.15
See application file for complete search history.

(56) References Cited

U.S. PATENT DOCUMENTS

| | | |
|---|---|---|
| 7,046,568 B2 | 5/2006 | Cernea |
| 11,398,280 B1* | 7/2022 | Lien ................... G11C 16/0483 |
| 2022/0208276 A1 | 6/2022 | Wu et al. |
| 2023/0085776 A1 | 3/2023 | Bassa et al. |

* cited by examiner

*Primary Examiner* — Son T Dinh
(74) *Attorney, Agent, or Firm* — Dickinson Wright PLLC

(57) ABSTRACT

A memory apparatus and method of operation are provided. The apparatus includes memory cells disposed in memory holes connected to bit lines. The memory cells retain a threshold voltage corresponding to data states. A control means applies a bit line voltage to the bit lines while determining whether the memory cells have the threshold voltage above one or more read levels associated with each of the data states in a first portion of a read operation. The control means groups the memory cells targeted for ones of the data states into data state groups based on the first portion of the read operation. The control means also supplies a near zero voltage to the bit lines coupled to the memory cells targeted for ones of the data states associated with at least one of the data state groups while reading the memory cells in subsequent portions of the read operation.

20 Claims, 33 Drawing Sheets

TABLE 1 (700)

| TABLE 1 | Er | A | B | C | D | E | F | G |
|---|---|---|---|---|---|---|---|---|
| LP | 1 | 0 | 0 | 0 | 0 | 1 | 1 | 1 |
| MP | 1 | 1 | 1 | 0 | 1 | 1 | 0 | 0 |
| UP | 1 | 1 | 0 | 0 | 0 | 0 | 0 | 1 |

*FIG. 8A*

STATE OF CELLS DURING DIFFERENT READS IN 2-3-2 READ (760)

| READ PAGE | READ LEVEL | Er | A | B | C | D | E | F | G | REDUCTION OF ADDITIONAL MEMORY STATES |
|---|---|---|---|---|---|---|---|---|---|---|
| LP | AR | C | NC | NC | NC | NC | NC | NC | NC | - |
|    | ER | IC | C | C | C | C | NC | NC | NC | - |
| MP | BR | EIC | IC | NC | C | NC | NC | NC | NC | 1/2 |
|    | DR | IC | IC | C | IC | C | NC | NC | NC | - |
|    | FR | IC | IC | IC | IC | EIC | C | NC | NC | 1/2 |
| UP | CR | EIC | EIC | C | NC | EIC | NC | NC | NC | 2/3 |
|    | GR | IC | IC | EIC | EIC | EIC | EIC | C | NC | 3/4 |

*FIG. 8B*

FIG. 10A — Table 2 (900)

| TABLE 2 | Er | A | B | C | D | E | F | G |
|---|---|---|---|---|---|---|---|---|
| LP | 1 | 1 | 1 | 1 | 0 | 0 | 0 | 0 |
| MP | 1 | 1 | 0 | 0 | 1 | 1 | 0 | 0 |
| UP | 1 | 0 | 0 | 1 | 1 | 0 | 1 | 0 |

FIG. 10B — STATE OF CELLS DURING DIFFERENT READS IN 1-3-3 READ (950)

| READ PAGE | READ LEVEL | Er | A | B | C | D | E | F | G | REDUCTION OF ADDITIONAL MEMORY STATES |
|---|---|---|---|---|---|---|---|---|---|---|
| LP | DR | C | NC | NC | NC | NC | NC | NC | NC | 0 |
| MP | AR | C | C | NC | NC | NC | NC | NC | NC | 0 |
| MP | CR | IC | C | C | NC | NC | NC | NC | NC | 0 |
| MP | FR | IC | IC | IC | C | C | NC | NC | NC | 1/3 |
| UP | BR | EIC | EIC | C | NC | NC | NC | NC | NC | 1/2 |
| UP | ER | IC | IC | EIC | EIC | C | NC | NC | NC | 2/3 |
| UP | GR | IC | IC | IC | IC | IC | EIC | C | NC | 1/2 |

| PAGE | NORMAL READ | REVERSE READ |
|---|---|---|
| UP | A->R | E->A |
| MP | B->D->R | F->D->B |
| UP | C->G | G->C |

FIG. 13

| PAGE | | LP | | MP | | | UP | |
|---|---|---|---|---|---|---|---|---|
| READ LEVEL | | ER | AR | FR | DR | BR | GR | CR |
| BL CURRENT COMPONENT | CURRENT | ER+A+B+C+D | ER | ER+A+B+C+D+E | ER+A+B+C | ER+A | ER+A+B+C+D+E+F | ER+A+B |
| | PROPOSAL 1 | ER+A+B+C+D | ER | ER+E | ER+A+B+C | ER+A | ER+E+F | A+B |

*FIG. 16*

LP READ

SET SDL SEN
SDL=1

| N | Er | A | B | C | D | E | F | G |
|---|----|----|----|----|----|----|----|----|
| XDL | X | X | X | X | X | X | X | X |
|  |  |  |  |  |  |  |  |  |
| SDL | 1 | 1 | 1 | 1 | 1 | 1 | 1 | 1 |
| SEN | 1 | 1 | 1 | 1 | 1 | 1 | 1 | 1 |

SENPRE,LOSEN
SEN=1,SEN=SEN&SDL

| N | Er | A | B | C | D | E | F | G |
|---|----|----|----|----|----|----|----|----|
| XDL | X | X | X | X | X | X | X | X |
|  |  |  |  |  |  |  |  |  |
| SDL | 1 | 1 | 1 | 1 | 1 | 1 | 1 | 1 |
| SEN | 1 | 1 | 1 | 1 | 1 | 1 | 1 | 1 |

STROBE&DATA TRANSFER ER
SDL=~SEN&SDL

| N | Er | A | B | C | D | E | F | G |
|---|----|----|----|----|----|----|----|----|
| XDL | X | X | X | X | X | X | X | X |
|  |  |  |  |  |  |  |  |  |
| SDL | 1 | 1 | 1 | 1 | 1 | 0 | 0 | 0 |
| SEN | 0 | 0 | 0 | 0 | 0 | 1 | 1 | 1 |

SENPRE,LOSEN
SEN=1,SEN=SEN&SDL

| N | Er | A | B | C | D | E | F | G |
|---|----|----|----|----|----|----|----|----|
| XDL | X | X | X | X | X | X | X | X |
|  |  |  |  |  |  |  |  |  |
| SDL | 1 | 1 | 1 | 1 | 1 | 0 | 0 | 0 |
| SEN | 1 | 1 | 1 | 1 | 1 | 0 | 0 | 0 |

STROBE&DATA TRANSFER ER
SDL=~SEN, XDL=SDL
SDL=~SEN, ADL=SDL (CACHE)

| N | Er | A | B | C | D | E | F | G |
|---|----|----|----|----|----|----|----|----|
| XDL | 1 | 0 | 0 | 0 | 0 | 1 | 1 | 1 |
| ADL | 1 | 0 | 0 | 0 | 0 | 1 | 1 | 1 |
| SDL | 1 | 0 | 0 | 0 | 0 | 1 | 1 | 1 |
| SEN | 0 | 1 | 1 | 1 | 1 | 0 | 0 | 0 |

*FIG. 17*

MP READ (CURRENT)

SET SDL SEN
SDL=1

| | N | Er | A | B | C | D | E | F | G |
|---|---|---|---|---|---|---|---|---|---|
| XDL | | X | X | X | X | X | X | X | X |
| | | | | | | | | | |
| SDL | | 1 | 1 | 1 | 1 | 1 | 1 | 1 | 1 |
| SEN | | 1 | 1 | 1 | 1 | 1 | 1 | 1 | 1 |

SENPRE,LOSEN
SEN=1,SEN=SEN&SDL

| | N | Er | A | B | C | D | E | F | G |
|---|---|---|---|---|---|---|---|---|---|
| XDL | | X | X | X | X | X | X | X | X |
| | | | | | | | | | |
| SDL | | 1 | 1 | 1 | 1 | 1 | 1 | 1 | 1 |
| SEN | | 1 | 1 | 1 | 1 | 1 | 1 | 1 | 1 |

STROBE&DATA TRANSFER FR
SDL=~SEN&SDL

| | N | Er | A | B | C | D | E | F | G |
|---|---|---|---|---|---|---|---|---|---|
| XDL | | X | X | X | X | X | X | X | X |
| | | | | | | | | | |
| SDL | | 1 | 1 | 1 | 1 | 1 | 1 | 0 | 0 |
| SEN | | 0 | 0 | 0 | 0 | 0 | 0 | 1 | 1 |

SENPRE,LOSEN
SEN=1,SEN=SEN&SDL

| | N | Er | A | B | C | D | E | F | G |
|---|---|---|---|---|---|---|---|---|---|
| XDL | | X | X | X | X | X | X | X | X |
| | | | | | | | | | |
| SDL | | 1 | 1 | 1 | 1 | 1 | 1 | 0 | 0 |
| SEN | | 1 | 1 | 1 | 1 | 1 | 1 | 0 | 0 |

STROBE&DATA TRANSFER DR
SDL=~SEN

| | N | Er | A | B | C | D | E | F | G |
|---|---|---|---|---|---|---|---|---|---|
| XDL | | X | X | X | X | X | X | X | X |
| | | | | | | | | | |
| SDL | | 1 | 1 | 1 | 1 | 0 | 0 | 1 | 1 |
| SEN | | 0 | 0 | 0 | 0 | 1 | 1 | 0 | 0 |

*FIG. 18*

| SENPRE,LOSEN | N | Er | A | B | C | D | E | F | G |
|---|---|---|---|---|---|---|---|---|---|
| SDL=1, SEN=SEN&SDL | XDL | X | X | X | X | X | X | X | X |
| | | | | | | | | | |
| | SDL | 1 | 1 | 1 | 1 | 0 | 0 | 1 | 1 |
| | SEN | 1 | 1 | 1 | 1 | 0 | 0 | 1 | 1 |

| STROBE&DATA TRANSFER BR | N | Er | A | B | C | D | E | F | G |
|---|---|---|---|---|---|---|---|---|---|
| SDL=~SEN, XDL=SDL | XDL | 0 | 0 | 1 | 1 | 0 | 0 | 1 | 1 |
| SDL=~SEN, ADL=SDL (CACHE) | | | | | | | | | |
| | SDL | 0 | 0 | 1 | 1 | 0 | 0 | 1 | 1 |
| | SEN | 0 | 0 | 1 | 1 | 0 | 0 | 1 | 1 |

*FIG. 18*
*(CONT.)*

MP READ (PROPOSAL1)

SET SDL SEN
SDL=1

| N | Er | A | B | C | D | E | F | G |
|---|----|---|---|---|---|---|---|---|
| XDL | X | X | X | X | X | X | X | X |
| ADL | 1 | 0 | 0 | 0 | 0 | 1 | 1 | 1 |
| SDL | 1 | 0 | 0 | 0 | 0 | 1 | 1 | 1 |
| SEN | 1 | 1 | 1 | 1 | 1 | 1 | 1 | 1 |

SENPRE,LOSEN
SEN=1,SEN=SEN&SDL

| N | Er | A | B | C | D | E | F | G |
|---|----|---|---|---|---|---|---|---|
| XDL | X | X | X | X | X | X | X | X |
| ADL | 1 | 0 | 0 | 0 | 0 | 1 | 1 | 1 |
| SDL | 1 | 0 | 0 | 0 | 0 | 1 | 1 | 1 |
| SEN | 1 | 0 | 0 | 0 | 0 | 1 | 1 | 1 |

STROBE&DATA TRANSFER FR
SDL=~SEN&SDL

| N | Er | A | B | C | D | E | F | G |
|---|----|---|---|---|---|---|---|---|
| XDL | X | X | X | X | X | X | X | X |
| ADL | 1 | 0 | 0 | 0 | 0 | 1 | 1 | 1 |
| SDL | 1 | 1 | 1 | 1 | 1 | 1 | 0 | 0 |
| SEN | 0 | 0 | 0 | 0 | 0 | 0 | 1 | 1 |

SENPRE,LOSEN
SEN=1,SEN=SEN&SDL

| N | Er | A | B | C | D | E | F | G |
|---|----|---|---|---|---|---|---|---|
| XDL | X | X | X | X | X | X | X | X |
| ADL | 1 | 0 | 0 | 0 | 0 | 1 | 1 | 1 |
| SDL | 1 | 1 | 1 | 1 | 1 | 1 | 0 | 0 |
| SEN | 1 | 1 | 1 | 1 | 1 | 1 | 0 | 0 |

STROBE&DATA TRANSFER DR
SDL=~SEN

| N | Er | A | B | C | D | E | F | G |
|---|----|---|---|---|---|---|---|---|
| XDL | X | X | X | X | X | X | X | X |
| ADL | 1 | 0 | 0 | 0 | 0 | 1 | 1 | 1 |
| SDL | 1 | 1 | 1 | 1 | 0 | 0 | 1 | 1 |
| SEN | 0 | 0 | 0 | 0 | 1 | 1 | 0 | 0 |

FIG. 19

SENPRE,LOSEN
SDL=1, SEN=SEN&SDL

| N | Er | A | B | C | D | E | F | G |
|---|----|---|---|---|---|---|---|---|
| XDL | X | X | X | X | X | X | X | X |
| ADL | 1 | 0 | 0 | 0 | 0 | 1 | 1 | 1 |
| SDL | 1 | 1 | 1 | 1 | 0 | 0 | 1 | 1 |
| SEN | 1 | 1 | 1 | 1 | 0 | 0 | 1 | 1 |

STROBE&DATA TRANSFER BR
SDL=~SEN, XDL=SDL
SDL=~SEN, BDL=SDL (CACHE)

| N | Er | A | B | C | D | E | F | G |
|---|----|---|---|---|---|---|---|---|
| XDL | 0 | 0 | 1 | 1 | 0 | 0 | 1 | 1 |
| ADL | 1 | 0 | 0 | 0 | 0 | 1 | 1 | 1 |
| SDL | 0 | 0 | 1 | 1 | 0 | 0 | 1 | 1 |
| SEN | 0 | 0 | 1 | 1 | 0 | 0 | 1 | 1 |

*FIG. 19*
*(CONT.)*

UP READ (CURRENT)

SET SDL SEN
SDL=1

| N | Er | A | B | C | D | E | F | G |
|---|---|---|---|---|---|---|---|---|
| XDL | X | X | X | X | X | X | X | X |
| | | | | | | | | |
| SDL | 1 | 1 | 1 | 1 | 1 | 1 | 1 | 1 |
| SEN | 1 | 1 | 1 | 1 | 1 | 1 | 1 | 1 |

SENPRE,LOSEN
SEN=1,SEN=SEN&SDL

| N | Er | A | B | C | D | E | F | G |
|---|---|---|---|---|---|---|---|---|
| XDL | X | X | X | X | X | X | X | X |
| | | | | | | | | |
| SDL | 1 | 1 | 1 | 1 | 1 | 1 | 1 | 1 |
| SEN | 1 | 1 | 1 | 1 | 1 | 1 | 1 | 1 |

STROBE&DATA TRANSFER GR
SDL=~SEN&SDL

| N | Er | A | B | C | D | E | F | G |
|---|---|---|---|---|---|---|---|---|
| XDL | X | X | X | X | X | X | X | X |
| | | | | | | | | |
| SDL | 1 | 1 | 1 | 1 | 1 | 1 | 1 | 0 |
| SEN | 0 | 0 | 0 | 0 | 0 | 0 | 0 | 1 |

SENPRE,LOSEN
SEN=1,SEN=SEN&SDL

| N | Er | A | B | C | D | E | F | G |
|---|---|---|---|---|---|---|---|---|
| XDL | X | X | X | X | X | X | X | X |
| | | | | | | | | |
| SDL | 1 | 1 | 1 | 1 | 1 | 1 | 1 | 0 |
| SEN | 1 | 1 | 1 | 1 | 1 | 1 | 1 | 0 |

STROBE&DATA TRANSFER CR
SDL=~SEN, XDL=SDL
SDL=~SEN, ADL=SDL(CHASE)

| N | Er | A | B | C | D | E | F | G |
|---|---|---|---|---|---|---|---|---|
| XDL | 1 | 1 | 1 | 0 | 0 | 0 | 0 | 1 |
| | | | | | | | | |
| SDL | 1 | 1 | 1 | 0 | 0 | 0 | 0 | 1 |
| SEN | 0 | 0 | 0 | 1 | 1 | 1 | 1 | 0 |

*FIG. 20*

UP READ (PROPOSAL1)

SET SDL SEN
SDL=ADL

| N   | Er | A | B | C | D | E | F | G |
|-----|----|---|---|---|---|---|---|---|
| XDL | X  | X | X | X | X | X | X | X |
| ADL | 1  | 0 | 0 | 0 | 0 | 1 | 1 | 1 |
| SDL | 1  | 0 | 0 | 0 | 0 | 1 | 1 | 1 |
| SEN | 1  | 1 | 1 | 1 | 1 | 1 | 1 | 1 |

SENPRE,LOSEN
SEN=1,SEN=SEN&SDL

| N   | Er | A | B | C | D | E | F | G |
|-----|----|---|---|---|---|---|---|---|
| XDL | X  | X | X | X | X | X | X | X |
| ADL | 1  | 0 | 0 | 0 | 0 | 1 | 1 | 1 |
| SDL | 1  | 0 | 0 | 0 | 0 | 1 | 1 | 1 |
| SEN | 1  | 0 | 0 | 0 | 0 | 1 | 1 | 1 |

STROBE&DATA TRANSFER GR
SDL=~SEN&SDL

| N   | Er | A | B | C | D | E | F | G |
|-----|----|---|---|---|---|---|---|---|
| XDL | X  | X | X | X | X | X | X | X |
| ADL | 1  | 0 | 0 | 0 | 0 | 1 | 1 | 1 |
| SDL | 1  | 1 | 1 | 1 | 1 | 1 | 1 | 0 |
| SEN | 0  | 0 | 0 | 0 | 0 | 0 | 0 | 1 |

SENPRE,LOSEN
SEN=1,SEN=SEN&SDL

| N   | Er | A | B | C | D | E | F | G |
|-----|----|---|---|---|---|---|---|---|
| XDL | X  | X | X | X | X | X | X | X |
| ADL | 1  | 0 | 0 | 0 | 0 | 1 | 1 | 1 |
| SDL | 1  | 1 | 1 | 1 | 1 | 1 | 1 | 0 |
| SEN | 1  | 1 | 1 | 1 | 1 | 1 | 1 | 0 |

STROBE&DATA TRANSFER CR
SDL=~SEN, XDL=SDL
SDL=~SEN, ADL=SDL(CHASE)

| N   | Er | A | B | C | D | E | F | G |
|-----|----|---|---|---|---|---|---|---|
| XDL | 1  | 1 | 1 | 0 | 0 | 0 | 0 | 1 |
| ADL | 1  | 0 | 0 | 0 | 0 | 1 | 1 | 1 |
| SDL | 1  | 1 | 1 | 0 | 0 | 0 | 0 | 1 |
| SEN | 0  | 0 | 0 | 1 | 1 | 1 | 1 | 0 |

*FIG. 21*

| PAGE | LP | | MP | | | | UP | |
|---|---|---|---|---|---|---|---|---|
| READ LEVEL | ER | AR | FR | DR | BR | GR | CR |
| BL CURRENT COMPONENT CURRENT | ER+A+B+C+D | ER | ER+A+B+C+D+E | ER+A+B+C | ER+A | ER+A+B+C+D+E+F | ER | ER+A+B |
| BL CURRENT COMPONENT PROPOSAL 2 | ER+A+B+C+D | ER | E | A+B+C | A | E+F | | A+B |

FIG. 23

LP READ (CURRENT)

SET SDL SEN
SDL=1

| N | Er | A | B | C | D | E | F | G |
|---|----|----|----|----|----|----|----|----|
| XDL | X | X | X | X | X | X | X | X |
| | | | | | | | | |
| SDL | 1 | 1 | 1 | 1 | 1 | 1 | 1 | 1 |
| SEN | 1 | 1 | 1 | 1 | 1 | 1 | 1 | 1 |

SENPRE,LOSEN
SEN=1,SEN=SEN&SDL

| N | Er | A | B | C | D | E | F | G |
|---|----|----|----|----|----|----|----|----|
| XDL | X | X | X | X | X | X | X | X |
| | | | | | | | | |
| SDL | 1 | 1 | 1 | 1 | 1 | 1 | 1 | 1 |
| SEN | 1 | 1 | 1 | 1 | 1 | 1 | 1 | 1 |

STROBE&DATA TRANSFER GR
SDL=~SEN&SDL

| N | Er | A | B | C | D | E | F | G |
|---|----|----|----|----|----|----|----|----|
| XDL | X | X | X | X | X | X | X | X |
| | | | | | | | | |
| SDL | 1 | 1 | 1 | 1 | 1 | 0 | 0 | 0 |
| SEN | 0 | 0 | 0 | 0 | 0 | 1 | 1 | 1 |

SENPRE,LOSEN
SEN=1,SEN=SEN&SDL

| N | Er | A | B | C | D | E | F | G |
|---|----|----|----|----|----|----|----|----|
| XDL | X | X | X | X | X | X | X | X |
| | | | | | | | | |
| SDL | 1 | 1 | 1 | 1 | 1 | 0 | 0 | 0 |
| SEN | 1 | 1 | 1 | 1 | 1 | 0 | 0 | 0 |

STROBE&DATA TRANSFER ER
SDL=~SEN, XDL=SDL
SDL=~SEN, ADL=SDL(CACHE)

| N | Er | A | B | C | D | E | F | G |
|---|----|----|----|----|----|----|----|----|
| XDL | 1 | 0 | 0 | 0 | 0 | 1 | 1 | 1 |
| ADL | 1 | 0 | 0 | 0 | 0 | 1 | 1 | 1 |
| SDL | 1 | 0 | 0 | 0 | 0 | 1 | 1 | 1 |
| SEN | 0 | 1 | 1 | 1 | 1 | 0 | 0 | 0 |

*FIG. 24*

LP READ (PROPOSAL 2)

SET SDL SEN
SDL=1

| N | Er | A | B | C | D | E | F | G |
|---|----|---|---|---|---|---|---|---|
| XDL | X | X | X | X | X | X | X | X |
|  |  |  |  |  |  |  |  |  |
| SDL | 1 | 1 | 1 | 1 | 1 | 1 | 1 | 1 |
| SEN | 1 | 1 | 1 | 1 | 1 | 1 | 1 | 1 |

SENPRE,LOSEN
SEN=1,SEN=SEN&SDL

| N | Er | A | B | C | D | E | F | G |
|---|----|---|---|---|---|---|---|---|
| XDL | X | X | X | X | X | X | X | X |
|  |  |  |  |  |  |  |  |  |
| SDL | 1 | 1 | 1 | 1 | 1 | 1 | 1 | 1 |
| SEN | 1 | 1 | 1 | 1 | 1 | 1 | 1 | 1 |

STROBE&DATA TRANSFER GR
SDL=~SEN&SDL
ADL<=SDL

| N | Er | A | B | C | D | E | F | G |
|---|----|---|---|---|---|---|---|---|
| XDL | X | X | X | X | X | X | X | X |
| ADL | 1 | 1 | 1 | 1 | 1 | 0 | 0 | 0 |
| SDL | 1 | 1 | 1 | 1 | 1 | 0 | 0 | 0 |
| SEN | 0 | 0 | 0 | 0 | 0 | 1 | 1 | 1 |

SENPRE,LOSEN
SDL=1
SEN=1,SEN=SEN&SDL

| N | Er | A | B | C | D | E | F | G |
|---|----|---|---|---|---|---|---|---|
| XDL | X | X | X | X | X | X | X | X |
| ADL | 1 | 1 | 1 | 1 | 1 | 0 | 0 | 0 |
| SDL | 1 | 1 | 1 | 1 | 1 | 1 | 1 | 1 |
| SEN | 1 | 1 | 1 | 1 | 1 | 1 | 1 | 1 |

STROBE&DATA TRANSFER AR
SDL=~SEN; SDL=ADL&SEN
BDL=SEN

| N | Er | A | B | C | D | E | F | G |
|---|----|---|---|---|---|---|---|---|
| XDL | 1 | 0 | 0 | 0 | 0 | 1 | 1 | 1 |
| ADL | 1 | 1 | 1 | 1 | 1 | 0 | 0 | 0 |
| BDL | 0 | 1 | 1 | 1 | 1 | 1 | 1 | 1 |
| SDL | 0 | 1 | 1 | 1 | 1 | 1 | 1 | 1 |
| SEN | 0 | 1 | 1 | 1 | 1 | 1 | 1 | 1 |

*FIG. 25*

MP READ (PROPOSAL 2)

SET SDL SEN
SDL=~ADL

| N | Er | A | B | C | D | E | F | G |
|---|---|---|---|---|---|---|---|---|
| XDL | X | X | X | X | X | X | X | X |
| ADL | 1 | 1 | 1 | 1 | 1 | 0 | 0 | 0 |
| BDL | 0 | 1 | 1 | 1 | 1 | 1 | 1 | 1 |
| SDL | 0 | 0 | 0 | 0 | 0 | 1 | 1 | 1 |
| SEN | 0 | 0 | 0 | 0 | 0 | 1 | 1 | 1 |

SENPRE,LOSEN
SEN=1,SEN=SEN&SDL

| N | Er | A | B | C | D | E | F | G |
|---|---|---|---|---|---|---|---|---|
| XDL | X | X | X | X | X | X | X | X |
| ADL | 1 | 1 | 1 | 1 | 1 | 0 | 0 | 0 |
| BDL | 0 | 1 | 1 | 1 | 1 | 1 | 1 | 1 |
| SDL | 0 | 0 | 0 | 0 | 0 | 1 | 1 | 1 |
| SEN | 0 | 0 | 0 | 0 | 0 | 1 | 1 | 1 |

STROBE&DATA TRANSFER FR
SDL=~SEN&BDL

| N | Er | A | B | C | D | E | F | G |
|---|---|---|---|---|---|---|---|---|
| XDL | X | X | X | X | X | X | X | X |
| ADL | 1 | 1 | 1 | 1 | 1 | 0 | 0 | 0 |
| BDL | 0 | 1 | 1 | 1 | 1 | 1 | 1 | 1 |
| SDL | 0 | 1 | 1 | 1 | 1 | 1 | 0 | 0 |
| SEN | 0 | 0 | 0 | 0 | 0 | 0 | 1 | 1 |

SENPRE,LOSEN
SEN=1,SEN=SEN&SDL

| N | Er | A | B | C | D | E | F | G |
|---|---|---|---|---|---|---|---|---|
| XDL | X | X | X | X | X | X | X | X |
| ADL | 1 | 1 | 1 | 1 | 1 | 0 | 0 | 0 |
| BDL | 0 | 1 | 1 | 1 | 1 | 1 | 1 | 1 |
| SDL | 0 | 1 | 1 | 1 | 1 | 1 | 0 | 0 |
| SEN | 0 | 1 | 1 | 1 | 1 | 1 | 0 | 0 |

STROBE&DATA TRANSFER DR
SDL=~SEN&BDL

| N | Er | A | B | C | D | E | F | G |
|---|---|---|---|---|---|---|---|---|
| XDL | X | X | X | X | X | X | X | X |
| ADL | 1 | 1 | 1 | 1 | 1 | 0 | 0 | 0 |
| BDL | 0 | 1 | 1 | 1 | 1 | 1 | 1 | 1 |
| SDL | 0 | 1 | 1 | 1 | 0 | 0 | 1 | 1 |
| SEN | 0 | 0 | 0 | 0 | 1 | 1 | 0 | 0 |

*FIG. 26*

SENPRE,LOSEN
SEN=1, SEN=SEN&SDL

| N | Er | A | B | C | D | E | F | G |
|---|----|---|---|---|---|---|---|---|
| XDL | X | X | X | X | X | X | X | X |
| ADL | 1 | 1 | 1 | 1 | 1 | 0 | 0 | 0 |
| BDL | 0 | 1 | 1 | 1 | 1 | 1 | 1 | 1 |
| SDL | 0 | 1 | 1 | 1 | 0 | 0 | 1 | 1 |
| SEN | 0 | 1 | 1 | 1 | 0 | 0 | 1 | 1 |

STROBE&DATA TRANSFER BR
SDL=~SEN , XDL=SDL

| N | Er | A | B | C | D | E | F | G |
|---|----|---|---|---|---|---|---|---|
| XDL | 1 | 1 | 0 | 0 | 1 | 1 | 0 | 0 |
| ADL | 1 | 1 | 1 | 1 | 1 | 0 | 0 | 0 |
| BDL | 0 | 1 | 1 | 1 | 1 | 1 | 1 | 1 |
| SDL | 1 | 1 | 0 | 0 | 1 | 1 | 0 | 0 |

*FIG. 26*
*(CONT.)*

UP READ (PROPOSAL 2)

SET SDL SEN
SDL=~ADL

| N | Er | A | B | C | D | E | F | G |
|---|----|---|---|---|---|---|---|---|
| XDL | X | X | X | X | X | X | X | X |
| ADL | 1 | 1 | 1 | 1 | 1 | 0 | 0 | 0 |
| BDL | 0 | 1 | 1 | 1 | 1 | 1 | 1 | 1 |
| SDL | 0 | 0 | 0 | 0 | 0 | 1 | 1 | 1 |
| SEN | 0 | 0 | 0 | 0 | 0 | 1 | 1 | 1 |

SENPRE,LOSEN
SEN=1,SEN=SEN&SDL

| N | Er | A | B | C | D | E | F | G |
|---|----|---|---|---|---|---|---|---|
| XDL | X | X | X | X | X | X | X | X |
| ADL | 1 | 1 | 1 | 1 | 1 | 0 | 0 | 0 |
| BDL | 0 | 1 | 1 | 1 | 1 | 1 | 1 | 1 |
| SDL | 0 | 0 | 0 | 0 | 0 | 1 | 1 | 1 |
| SEN | 0 | 0 | 0 | 0 | 0 | 1 | 1 | 1 |

STROBE&DATA TRANSFER GR
SDL=~SEN&BDL

| N | Er | A | B | C | D | E | F | G |
|---|----|---|---|---|---|---|---|---|
| XDL | X | X | X | X | X | X | X | X |
| ADL | 1 | 1 | 1 | 1 | 1 | 0 | 0 | 0 |
| BDL | 0 | 1 | 1 | 1 | 1 | 1 | 1 | 1 |
| SDL | 0 | 1 | 1 | 1 | 1 | 1 | 1 | 0 |
| SEN | 0 | 0 | 0 | 0 | 0 | 0 | 0 | 1 |

SENPRE,LOSEN
SEN=1,SEN=SEN&SDL

| N | Er | A | B | C | D | E | F | G |
|---|----|---|---|---|---|---|---|---|
| XDL | X | X | X | X | X | X | X | X |
| ADL | 1 | 1 | 1 | 1 | 1 | 0 | 0 | 0 |
| BDL | 0 | 1 | 1 | 1 | 1 | 1 | 1 | 1 |
| SDL | 0 | 1 | 1 | 1 | 1 | 1 | 1 | 0 |
| SEN | 0 | 1 | 1 | 1 | 1 | 1 | 1 | 0 |

STROBE&DATA TRANSFER CR
SDL=~SEN, XDL=SDL

| N | Er | A | B | C | D | E | F | G |
|---|----|---|---|---|---|---|---|---|
| XDL | 1 | 1 | 1 | 0 | 0 | 0 | 0 | 1 |
| ADL | 1 | 1 | 1 | 1 | 1 | 0 | 0 | 0 |
| BDL | 0 | 1 | 1 | 1 | 1 | 1 | 1 | 1 |
| SDL | 1 | 1 | 1 | 0 | 0 | 0 | 0 | 1 |
| SEN | 0 | 0 | 0 | 1 | 1 | 1 | 1 | 0 |

FIG. 27

| SEQUENTIAL READ (REVERSE READ) CACHE RELEASE | | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|---|
| | B6X4 (3444) | | | | | | | | | | | | | | | | |
| T | ('S1', 'S3', 'S7', 'S13') | 1 | 0 | 0 | 1 | 1 | 1 | 1 | 0 | 0 | 0 | 0 | 0 | 0 | 1 | 1 | 1 |
| U | ('S2', 'S8', 'S10', 'S12') | 1 | 1 | 0 | 0 | 0 | 0 | 0 | 0 | 1 | 1 | 0 | 0 | 1 | 1 | 1 | 1 |
| M | ('S4', 'S6', 'S9', 'S15') | 1 | 1 | 1 | 1 | 0 | 0 | 1 | 1 | 1 | 0 | 0 | 0 | 0 | 0 | 0 | 1 |
| L | ('S5', 'S11', 'S14') | 1 | 1 | 1 | 1 | 1 | 0 | 0 | 0 | 0 | 0 | 0 | 1 | 1 | 1 | 0 | 0 |

FIG. 28

OPTIMIZED READ CURRENT CONSUMPTION BASED ON LOWER PAGE READ INFORMATION FOR NON-VOLATILE MEMORY APPARATUS

CROSS-REFERENCE TO RELATED APPLICATIONS

This application claims the benefit of U.S. Provisional Application No. 63/472,663, filed on Jun. 13, 2023. The entire disclosure of the application referenced above is incorporated herein by reference.

FIELD

This application relates to non-volatile memory apparatuses and the operation of non-volatile memory apparatuses.

BACKGROUND

This section provides background information related to the technology associated with the present disclosure and, as such, is not necessarily prior art.

In order to improve read and program performance of memory devices, multiple charge storage elements or memory transistors in an array are read or programmed in parallel. Thus, a "page" of memory elements are typically read or programmed together. Both reading and verifying operations are performed by executing one or more sensing cycles in which the conduction current or threshold voltage of each memory cell of the page is determined relative to a demarcation value. In general, if the memory is partitioned into n states, there will be at least n−1 sensing passes or levels to resolve all possible memory states. In many implementations, each sensing cycle may also involve two or more passes or levels.

Power consumption is one important consideration of memory devices. With massively parallel sensing, the number of memory cells with conduction current flow will compound. Therefore, there is a need for high performance and high capacity non-volatile memory apparatuses with reduced power consumption during sensing operations.

SUMMARY

This section provides a general summary of the present disclosure and is not a comprehensive disclosure of its full scope or all of its features and advantages.

An object of the present disclosure is to provide a memory apparatus and a method of operating the memory apparatus that address and overcome the above-noted shortcomings.

Accordingly, it is an aspect of the present disclosure to provide a memory apparatus including memory cells each connected to one of a plurality of word lines and disposed in memory holes each connected to one of a plurality of bit lines. The memory cells are configured to retain a threshold voltage corresponding to one of a plurality of data states. A control means is coupled to the plurality of word lines and the plurality of bit lines and is configured to apply a bit line voltage to the plurality of bit lines while reading the memory cells to determine whether the memory cells have the threshold voltage above one or more of a plurality of read levels associated with each of the plurality of data states in a first portion of a read operation. The control means groups the memory cells targeted for ones of the plurality of data states into a plurality of data state groups based on the first portion of the read operation. The control means is also configured to supply a near zero voltage to the plurality of bit lines coupled to the memory cells targeted for ones of the plurality of data states associated with at least one of the plurality of data state groups while reading the memory cells targeted for one or more of the plurality of data states in subsequent portions of the read operation.

According to another aspect of the disclosure, a controller in communication with a memory apparatus including memory cells each connected to one of a plurality of word lines is provided. The memory cells are disposed in memory holes each connected to one of a plurality of bit lines. The memory cells are configured to retain a threshold voltage corresponding to one of a plurality of data states. The controller is configured to instruct the memory apparatus to apply a bit line voltage to the plurality of bit lines while reading the memory cells to determine whether the memory cells have the threshold voltage above one or more of a plurality of read levels associated with each of the plurality of data states in a first portion of a read operation. The controller groups the memory cells targeted for ones of the plurality of data states into a plurality of data state groups based on the first portion of the read operation. The controller is further configured to instruct the memory apparatus to supply a near zero voltage to the plurality of bit lines coupled to the memory cells targeted for ones of the plurality of data states associated with at least one of the plurality of data state groups while reading the memory cells targeted for one or more of the plurality of data states in subsequent portions of the read operation.

According to an additional aspect of the disclosure, a method of operating a memory apparatus is provided. The memory apparatus includes memory cells each connected to one of a plurality of word lines. The memory cells are disposed in memory holes each connected to one of a plurality of bit lines. The memory cells are configured to retain a threshold voltage corresponding to one of a plurality of data states. The method includes the step of applying a bit line voltage to the plurality of bit lines while reading the memory cells to determine whether the memory cells have the threshold voltage above one or more of a plurality of read levels associated with each of the plurality of data states in a first portion of a read operation. The method continues with the step of grouping the memory cells targeted for ones of the plurality of data states into a plurality of data state groups based on the first portion of the read operation. The method also includes the step of supplying a near zero voltage to the plurality of bit lines coupled to the memory cells targeted for ones of the plurality of data states associated with at least one of the plurality of data state groups while reading the memory cells targeted for one or more of the plurality of data states in subsequent portions of the read operation.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 8A is a schematic read level chart illustrating one embodiment of a read operation utilizing the method of FIG. 7 according to aspects of the disclosure;

FIG. 8B is a chart illustrating one embodiment of locking out or inhibiting conducting cells during a read level during a read operation following a read scheme of read level chart of FIG. 8A according to aspects of the disclosure;

FIG. 10A is a schematic read level chart illustrating one embodiment of a read operation discerning the Gray code of FIG. 9 according to aspects of the disclosure;

FIG. 10B is a chart illustrating one embodiment of locking out or inhibiting conducting cells during a read level during a read operation following a read scheme of read level chart of FIG. 10A according to aspects of the disclosure;

FIG. 13 is a table illustrating sequences or series of the data states being sensed for each of a lower page (LP), middle page (MP), and upper page (UP) for both the normal read and the reverse read according to aspects of the disclosure;

Figure 15:
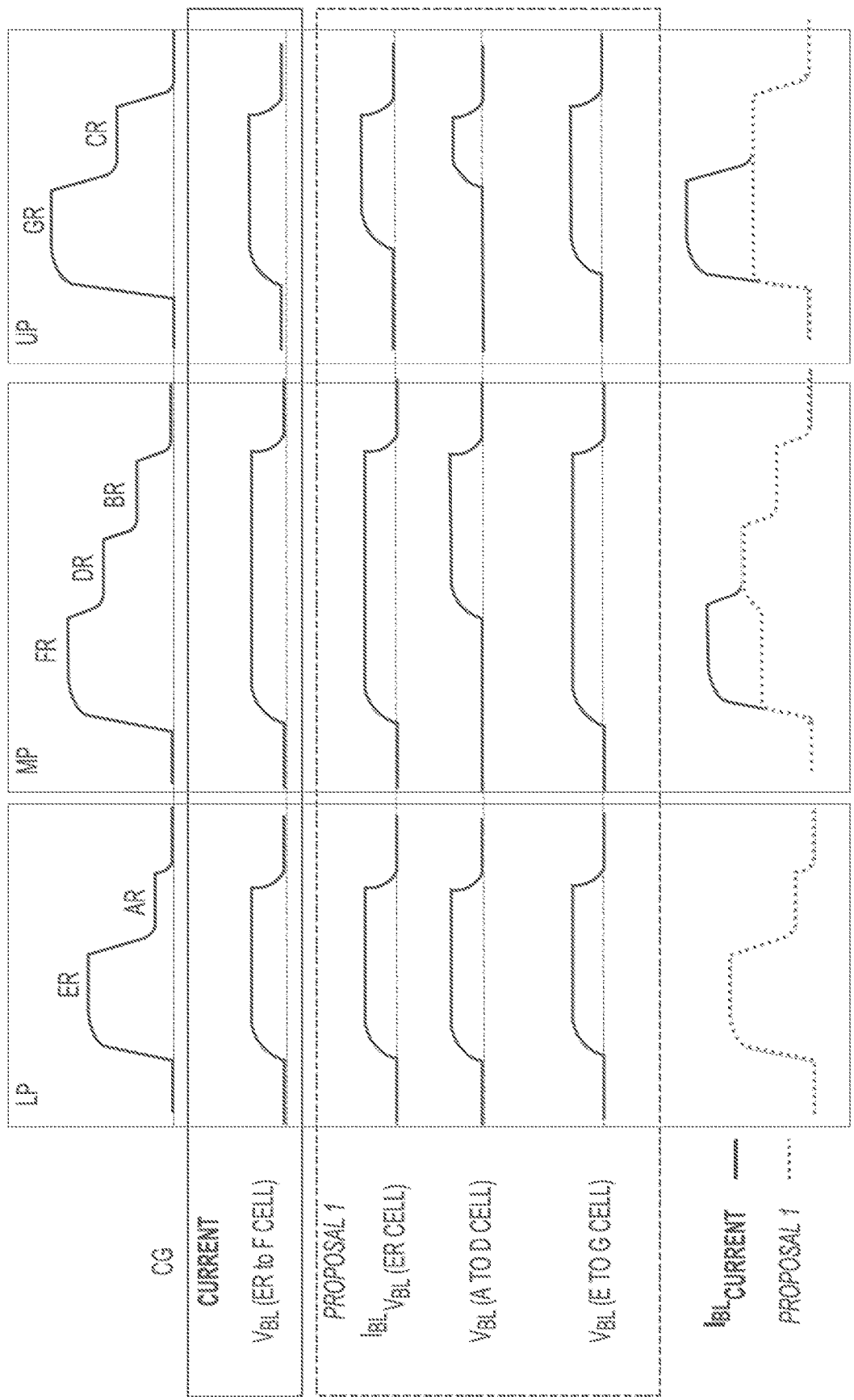
Figure 22:
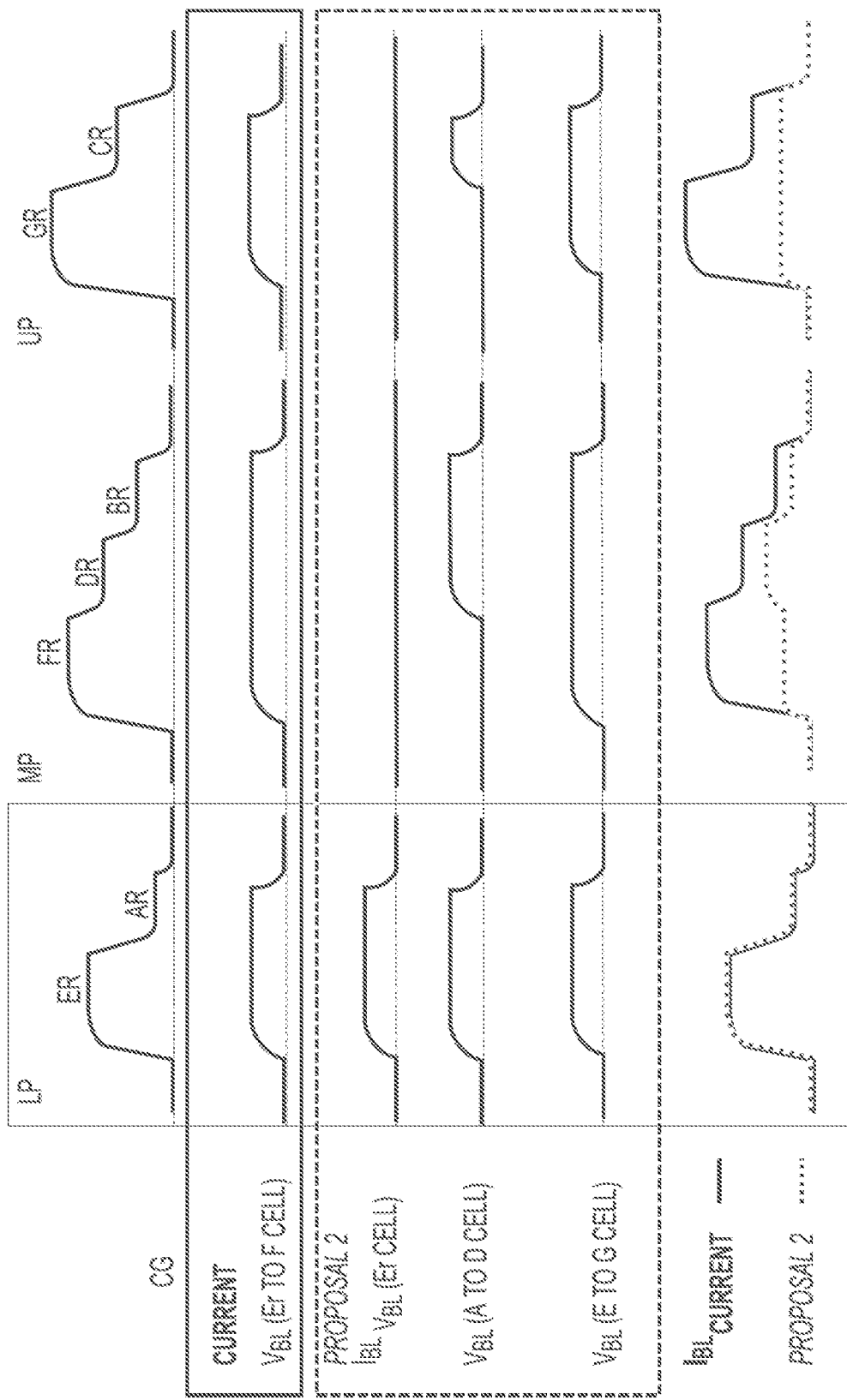
Figure 29:
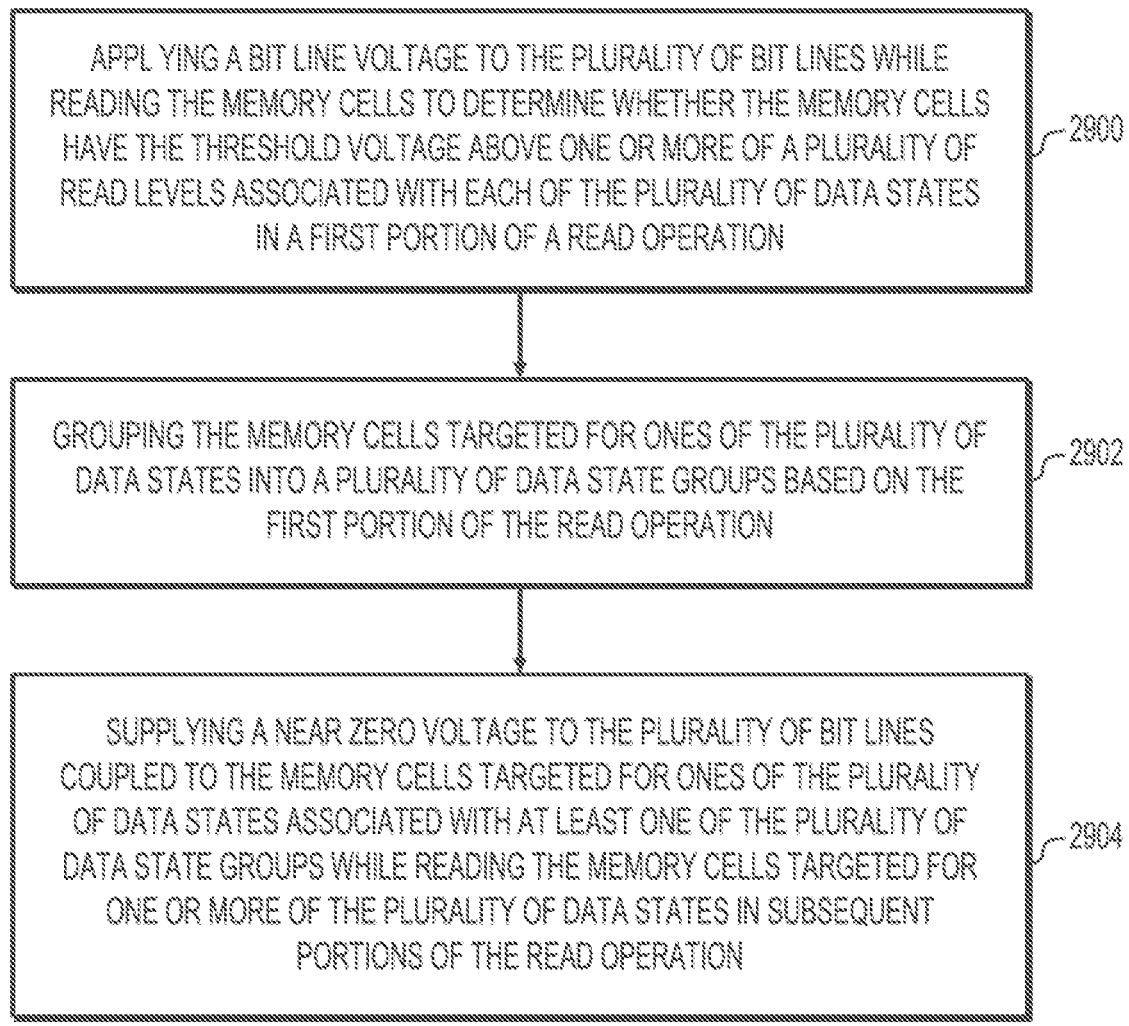

FIG. 15 shows a plot of the voltages applied to the word lines, the bit lines coupled to memory cells targeted for various data states during a lower page portion, middle page portion, and upper page portion of a reverse order read operation along with overall combined current of all of the bit lines for both a current reverse order read and using selective pre-charging of the bit lines based on the lower page read information according to aspects of the disclosure;

FIG. 16 is a table summarizing the bit line current components for each data state of LP, MP, and UP reads for both the current reverse order read and using selective pre-charging of the bit lines based on the lower page read information according to aspects of the disclosure;

FIGS. 17-21 show levels or contents of the cache, lower bit latch, trip latch, sense node for each of the plurality of data states for LP, MP, and UP reads for both the current reverse order read and using selective pre-charging of the bit lines based on the lower page read information according to aspects of the disclosure;

FIG. 22 shows a plot of the voltages applied to the word lines, the bit lines coupled to memory cells targeted for various data states during a lower page portion, middle page portion, and upper page portion of a reverse order read operation along with overall combined current of all of the bit lines for both a current reverse order read and using another selective pre-charging of the bit lines based on the lower page read information according to aspects of the disclosure;

FIG. 23 is a table summarizing the bit line current components for each data state of the LP, MP, and UP reads for both the current reverse order read and using another selective pre-charging of the bit lines based on the lower page read information according to aspects of the disclosure;

FIGS. 24-27 show levels or contents of the cache, lower bit latch, trip latch, sense node for each of the plurality of data states for LP, MP, and UP reads for both the current reverse order read and using another selective pre-charging of the bit lines based on the lower page read information according to aspects of the disclosure;

FIG. 28 shows 3-4-4-4 coding for the data states and pages of QLC memory cells. As shown, LP information can be used to select bit lines to be open or pre-charged in the later MP/IP/TP read to save read current consumption according to aspects of the disclosure; and FIG. 29 illustrates steps of a method of operating a memory apparatus according to aspects of the disclosure.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following description, details are set forth to provide an understanding of the present disclosure. In some instances, certain circuits, structures and techniques have not been described or shown in detail in order not to obscure the disclosure.

In general, the present disclosure relates to non-volatile memory apparatuses of the type well-suited for use in many applications. The non-volatile memory apparatus and associated methods of operation of this disclosure will be described in conjunction with one or more example embodiments. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

In some memory devices or apparatuses, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical strings in a stack, where the stack comprises alternating conductive and dielectric layers. The conductive layers act as word lines which are connected to the memory cells. The memory cells can include data memory cells, which are eligible to store user data, and dummy or non-data memory cells which are ineligible to store user data.

Before programming certain non-volatile memory devices, the memory cells are typically erased. For some devices, the erase operation removes electrons from the floating gate of the memory cell being erased. Alternatively, the erase operation removes electrons from the charge trapping layer.

During a program operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming pulses until the programming is completed. Next, a second word line, WL1, is programmed using one or more programming pulses until the programming is completed, and so forth. A programming pulse may include a set of increasing program voltages which are applied to the word line in respective program loops or program-verify iterations. Verify operations or stages may be performed after each program voltage to determine whether the memory cells have completed programming. When programming is completed for a memory cell, it can be inhibited from further programming while programming continues for other memory cells in subsequent program loops.

Each memory cell may be associated with a data state according to write data in a program command. Based on its data state, a memory cell will either remain in the erased state or be programmed to a programmed data state. For example, in a three bit per cell memory device, there are eight data states including the erased state and the programmed state (see e.g., FIGS. 4 and 9).

After the memory cells are programmed, the data can be read back in a read operation. A read operation can involve applying a series of read voltages to a word line while sensing circuitry determines whether cells connected to the word line are in a conductive or non-conductive state. If a cell is in a non-conductive state, the threshold voltage Vt or Vth of the memory cell exceeds the read voltage. The read voltages are set at levels which are expected to be between the threshold voltage levels of adjacent data states.

The order of the sequence or series of read voltages applied to the word lines while sensing may include a series of read voltages of a normal read; however, a different or adjusted series of read voltages of a reverse read may be utilized instead to improve the speed of the read operation or for other reasons. In more detail, the read voltages for different data states vary in magnitude, with higher magnitude read voltages associated with sensing data states corresponding to higher threshold voltages and lower magnitude read voltages associated with sensing data states corresponding to sensing lower threshold voltages. In the normal read, the series of read voltages become increasing higher in magnitude with each successive data state that is being sensed. And in the reverse read, the adjusted series of read voltages become increasing lower in magnitude with each successive data state that is being sensed. Because, the series of read voltages typically begins with an initial voltage spike and then transitions to a first one of the series of read voltages, the speed of the read operation can be improved by applying the higher magnitude read voltage first, as in the reverse read, so that the voltage transition from the initial voltage spike is reduced.

One advantage of the normal read is that a "lockout" mode can be employed. In the lockout mode, the bit line connected to a string of any memory cells that are sensed as conducting when sensing for a lower data state can be set to zero (0) volts or locked out when sensing for a higher data state (i.e., because the memory cells sensed as conducting with lower read voltages are applied to the corresponding word line will of course also conduct when higher read voltages are applied). Accordingly, the current consumed by the memory device or apparatus can be reduced, as no current flows through those strings that are locked out as the higher data states are sensed. However, the lockout mode requires that the next read voltage or level of the series of read voltages to be higher than the current read level, such as in the normal read. So, while the reverse read can improve the speed of the read operation as described above, the lockout mode cannot be used with the reverse read to additionally reduce the current consumption of the memory device or apparatus.

Figure 1:
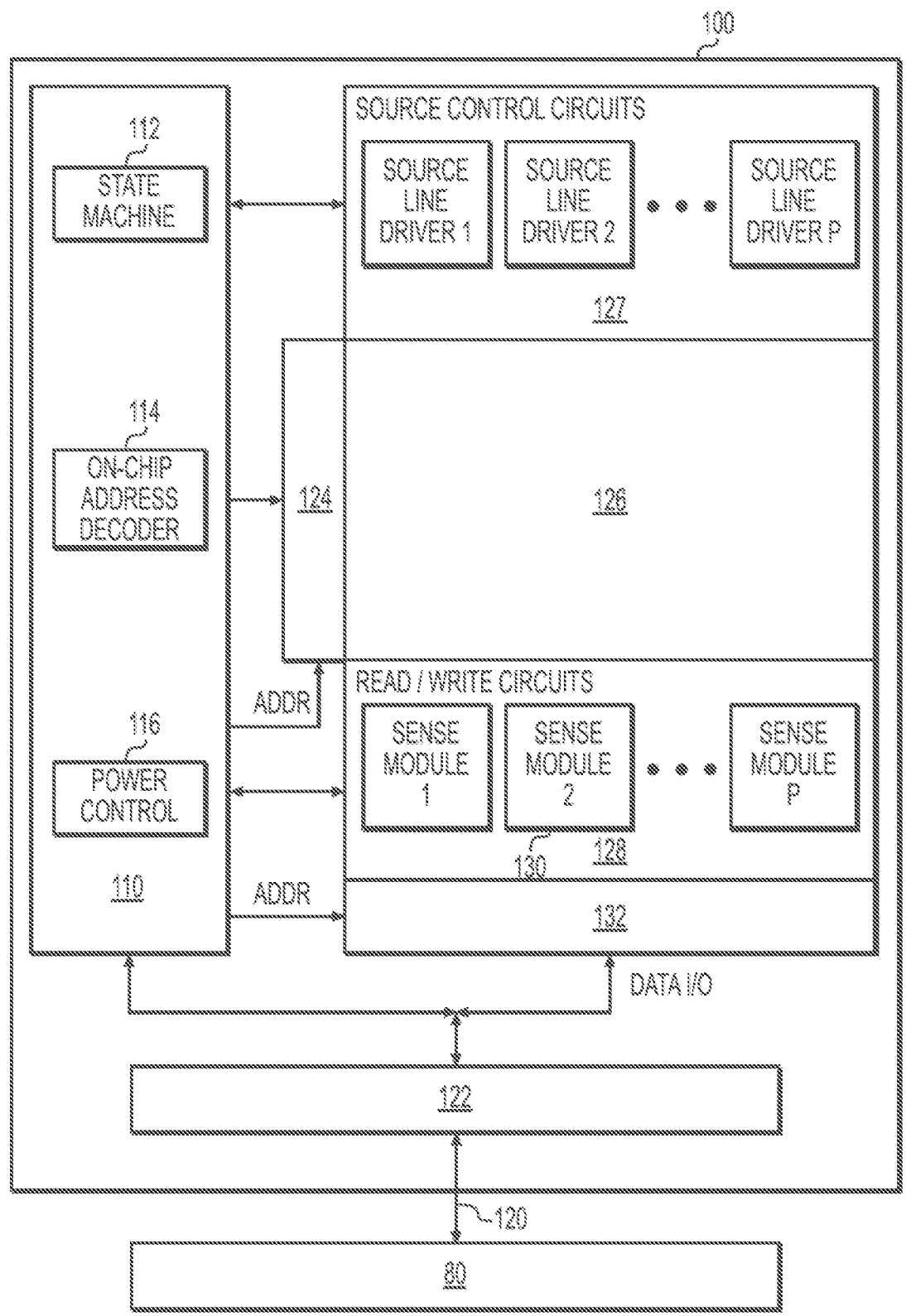
FIG. 1 is a schematic diagram illustrating one embodiment of a memory device according to aspects of the disclosure.

FIG. 1 is a schematic diagram illustrating one embodiment of a memory device 100. Memory device 100 includes a memory array 126 of memory cells, such as a two-dimensional array of memory cells or a three-dimensional array of memory cells. The memory array 126 may include memory cells according to an NAND flash type or NOR flash type architecture. Memory cells in a NAND configuration are accessed as a group and are typically connected in series. A NAND memory array is composed of multiple strings in which each string is composed of multiple memory cells sharing a bit line and accessed as a group. Memory cells in a NOR configuration may be accessed individually. NAND flash and NOR flash memory cells may be configured for long-term storage of information as non-volatile memory retaining information after power on/off cycles. Memory array 126 may also be other types of memory cells programmable to store multiple bits of data per cell as non-volatile memory or volatile memory and may be other types of memory cells in other configurations besides NAND or NOR configurations. Memory device 100 may include multiple dies of memory arrays 126.

Memory array 126 is addressable by word lines via a row decoder 124 and by bit lines via a column decoder 132. Row decoder 124 selects one or more word lines and the column decoder 132 selects one or more bit lines in order to apply appropriate voltages to the respective gates/drains of the addressed memory transistor.

Read/write circuits 128 are provided to read or write (program) the memory states of addressed memory transistors. Read/write circuits 128 include multiple sense modules 130 (sensing circuitry) that allow a page (or other unit) of memory cells to be read or sensed in parallel. Each sense module 130 includes bit line drivers and circuits for sensing.

Control circuitry 110 cooperates with read/write circuits 128 to perform memory operations on memory array 126. Control circuitry 110 may include a state machine 112, an on-chip address decoder 114, and a power control module 116. State machine 112 provides chip-level control of memory operations. On-chip address decoder 114 provides an address interface between a host or a memory controller to the hardware address used by decoders 124 and 132. Power control module 116 controls the power and voltages supplied to the word lines and bit lines during memory operations. Control circuitry 110 may include drivers for word lines, source side select lines (SGS), drain side select lines (SGD), and source lines. Control circuitry 110 is also in communication with source control circuits 127, which includes source line driver circuits used to drive varies voltages on the individual source lines.

Memory device 100 includes a controller 122 which operates with a host 80 through a link 120. Commands and data are transferred between a host and controller 122 via a link 120. Link 120 may be via a connection (e.g., a communication path), such as a bus or a wireless connection.

Memory device 100 may be used as storage memory, a main memory, a cache memory, a backup memory, or a redundant memory. Memory device 100 may be an internal storage drive, such as a notebook hard drive or a desktop hard drive. Memory device 100 may be a removable mass storage device, such as, but not limited to, a handheld, removable memory device, such as a memory card (e.g., a secure digital (SD) card, a micro secure digital (micro-SD) card, or a multimedia card (MMC)) or a universal serial bus (USB) device. Memory device 100 may take the form of an embedded mass storage device, such as an eSD/eMMC embedded flash drive, embedded in host 80. Memory device 100 may also be any other type of internal storage device, removable storage device, embedded storage device, external storage device, or network storage device.

Memory device 100 may be directly coupled to host 80 or may be indirectly coupled to host 80 via a network. For example, the network may include a data center storage system network, an enterprise storage system network, a storage area network, a cloud storage network, a local area network (LAN), a wide area network (WAN), the Internet, and/or another network.

Instructions may be executed by various components of memory device 100, such as by controller 100, controller circuitry 110, row decoder 124, column decoder 132, read/write circuits 128, source control circuits 127, logic gates, switches, latches, application specific integrated circuits (ASICs), programmable logic controllers, embedded microcontrollers, and other components of memory device 100.

Figure 2:
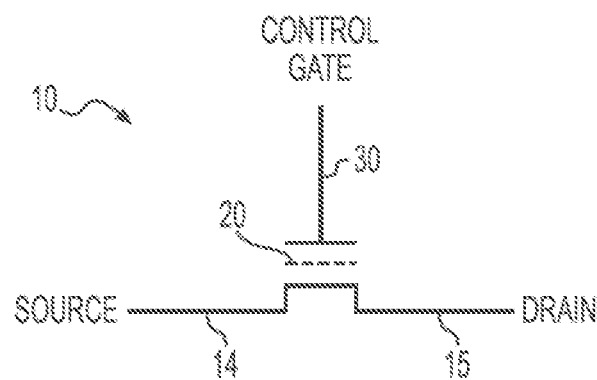
FIG. 2 is a schematic diagram illustrating one embodiment of a flash non-volatile memory cell according to aspects of the disclosure.

FIG. 2 is a schematic diagram illustrating one embodiment of a flash non-volatile memory cell 10. Memory cell 10 can be implemented by a field-effect transistor having a charge storage unit 20, such as a floating gate or a dielectric layer. Memory cell 10 also includes a source 14, a drain 16, and a control gate 30. A memory state of memory cell 10 may be read by sensing the conduction current across the source and drain electrodes of the cell when a reference voltage is applied to the control gate 30. For each given charge on the floating gate of a cell, a corresponding conduction current with respect to a fixed reference control gate voltage may be detected. A range of charge programmable onto the floating gate defines a corresponding threshold voltage window or a corresponding conduction current window of the memory states of memory cell 10.

Figure 3:
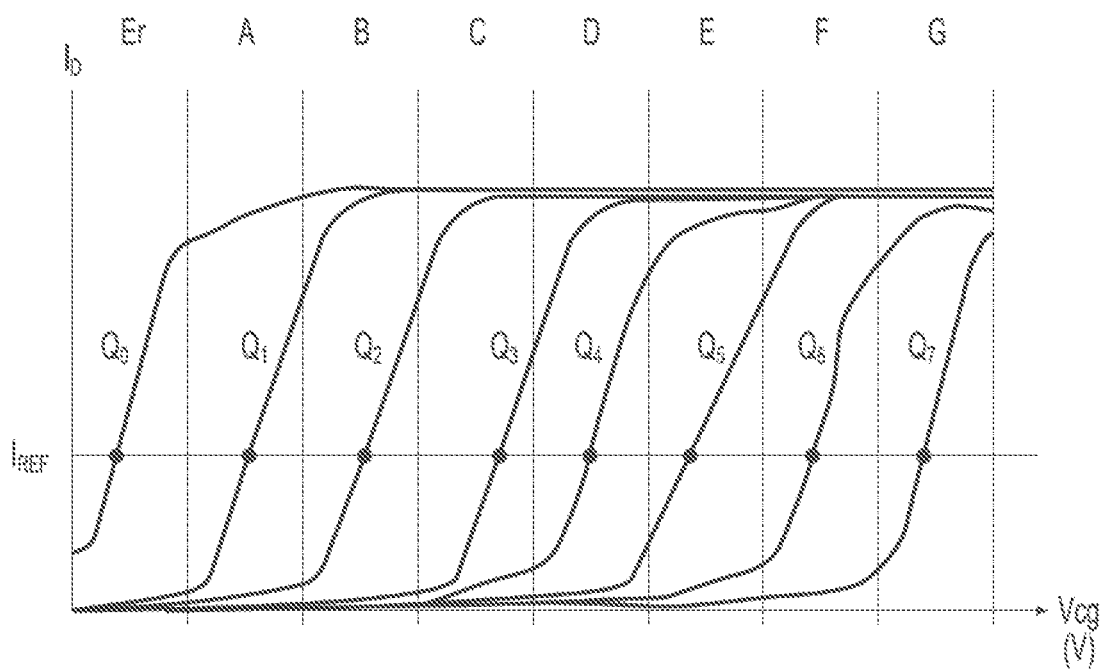
FIG. 3 is a schematic diagram illustrating one embodiment of the relation between a source-drain current and a control gate voltage for eight different charge levels that the floating gate of a memory cell may be selectively storing at any one time according to aspects of the disclosure.

FIG. 3 is a schematic diagram illustrating one embodiment of the relation between a source-drain current ID and a control gate voltage VCG for eight different charge levels Q0-Q7 that the floating gate of a memory cell, such as memory cell 10 of FIG. 2, may be selectively storing at any one time. The eight curves represent eight charge levels on a floating gate of a memory cell corresponding to eight possible memory states. Eight possible memory states representing one erased memory state ER and seven programmed states A, B, C, D, E, F, and G may be demarcated by partitioning the threshold window into eight regions. For example, if a reference current IREF is used, then a cell programmed with a charge level Q1 may be considered to be in an A memory state since its curve intersects with IREF in the region of the A threshold voltage window. If a reference current IREF is used, then a cell programmed with a charge level Q3 may be considered to be in a C memory state since its curve intersects with IREF in the region of the C threshold voltage window.

Figure 4:
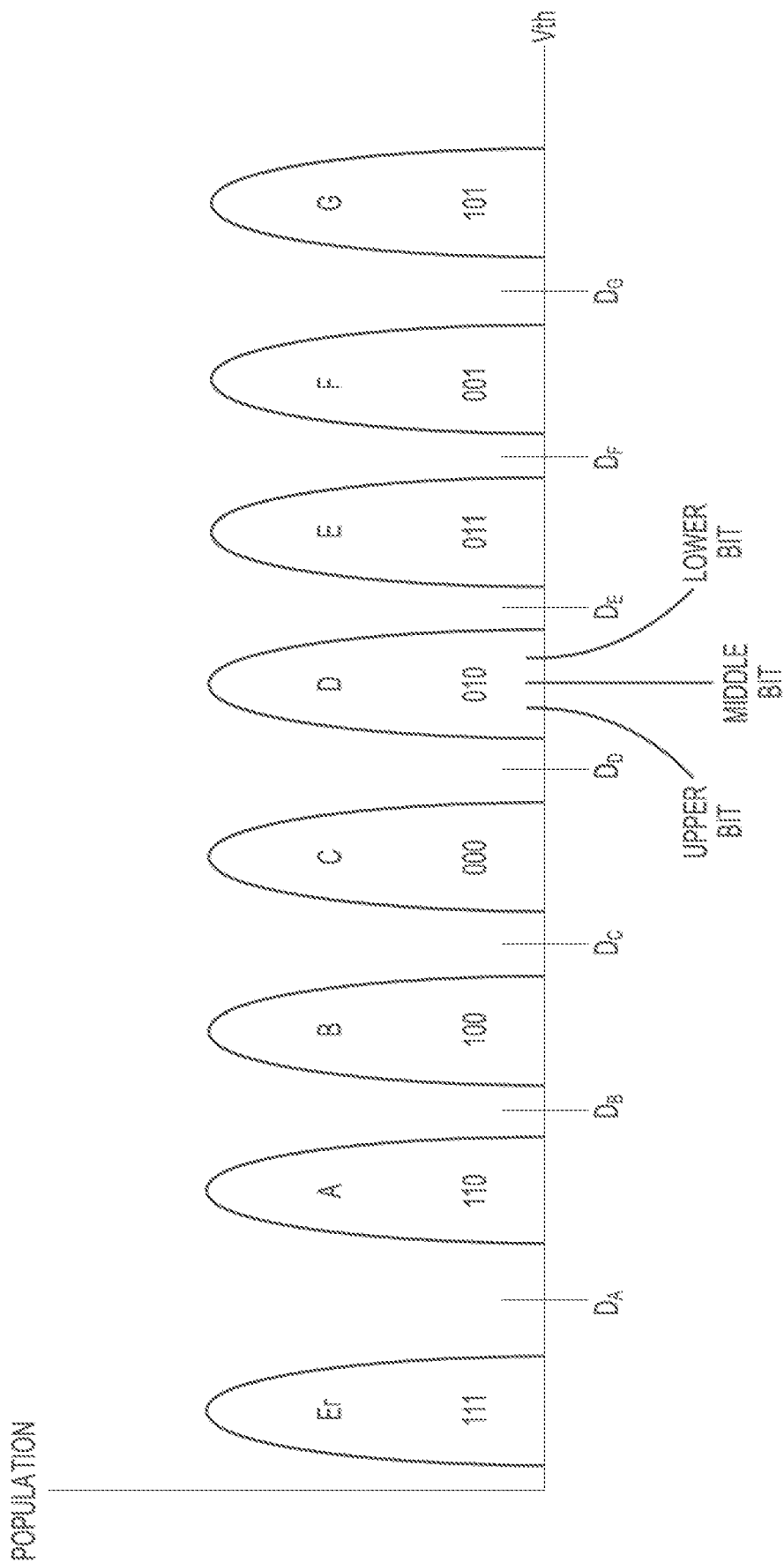
FIG. 4 is a schematic diagram illustrating one embodiment of threshold voltage distributions of a memory array with memory cells operable in eight memory states according to aspects of the disclosure.

FIG. 4 is a schematic diagram illustrating one embodiment of threshold voltage distributions of a memory array with memory cells operable in eight memory states. The possible threshold voltages of each memory cell spans a threshold window which is partitioned into eight regions to demarcate eight possible memory states, "Er", "A", "B", "C", "D", "E", "F" and "G". "Er" is an erased state or a ground state and "A" through "G" are seven progressively programmed states. During a read operation, the eight states may be demarcated by seven demarcation breakpoints of demarcation threshold voltages, DA, DB, DC, DD, DE, DF, and DG.

FIG. 4 also shows one embodiment of 3-bit gray coding represented by the eight possible memory states. Each of the eight memory states represented a triplet of upper, middle, and lower bits. In this embodiment, erased memory state represents "111", A memory state represents "110", B memory state represents "100", C memory state represents "000", D memory state represents "010", E memory state represents "011", F memory state represents "001", and G memory state represents "101." The 3 code bits, "lower", "middle" and "upper" bits, may be read or programmed separately. For example, in a first round, the lower bits of the memory cells may be read. In a second round, the middle bits of the memory cells may be read. In a third round, the upper bits of the memory cells may be read. Similarly in programming, in a first round the lower bits of the memory cells may be programmed and verified. In a second round the middle bits of the memory cells may be programmed and verified. In a third round the upper bits of the memory cells may be programmed and verified.

FIGS. 3 and 4 show a memory cell having eight memory states and operating as a triple-level cell (TLC) or X3 cell storing 3 bits/cell. In other embodiments, a memory cell may have more than eight memory states. For example, a memory cell may have sixteen memory states operating as a quadruple-level memory cell (QLC) or X4 cell storing 4 bits/cell.

Figure 5A:
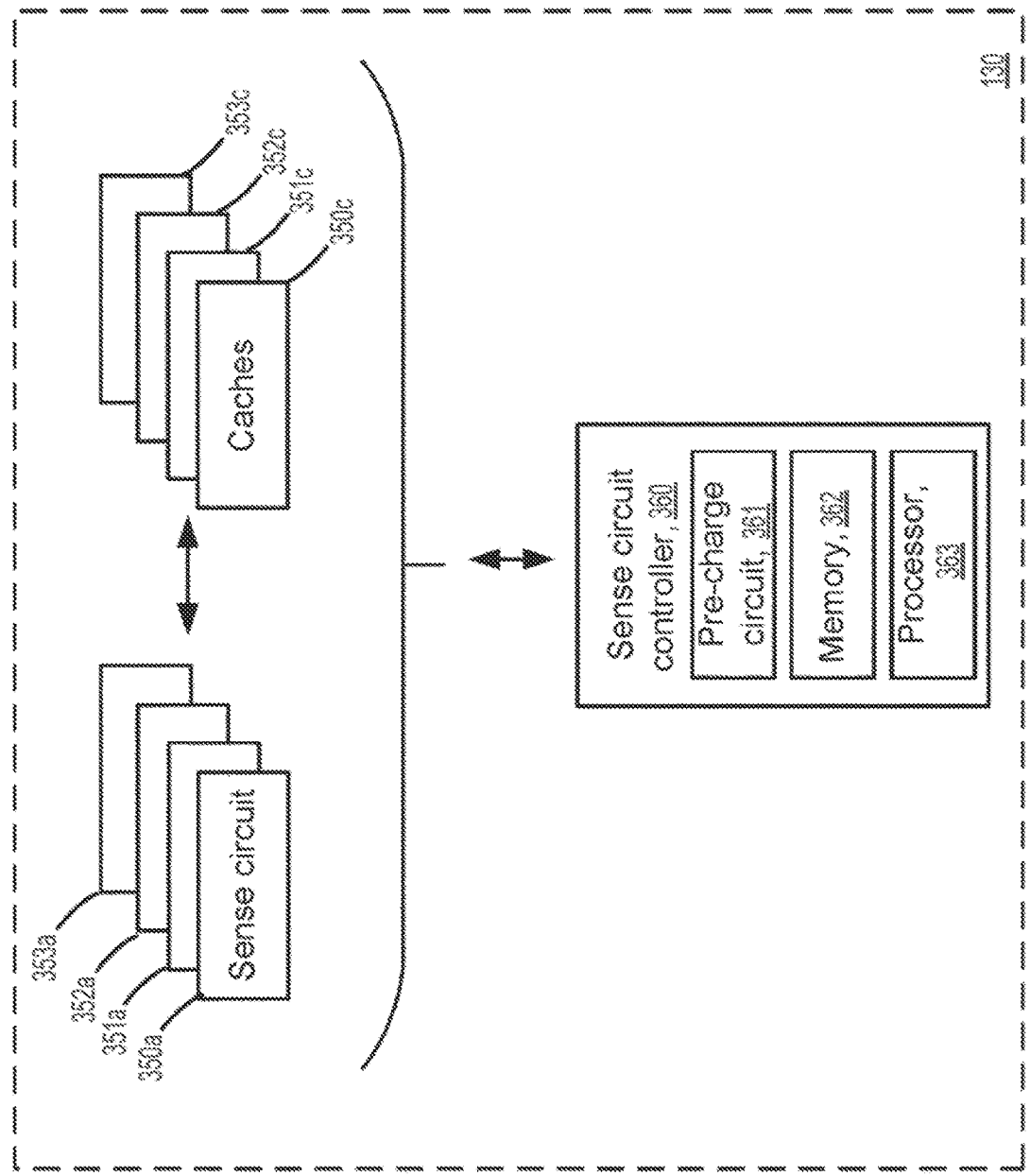
FIG. 5A depicts an example block diagram of a sense module of FIG. 1 according to aspects of the disclosure.

FIG. 5A depicts an example block diagram of a sense module 130 of FIG. 1. The memory apparatus can include multiple sense blocks, where each sense block performs sensing, e.g., read, operations for multiple memory cells via respective bit lines.

In one approach, a sense block comprises multiple sense circuits, also referred to as sense amplifiers. Each sense circuit is associated with data latches and caches. For example, the example sense circuits 350 a, 351 a, 352 a and 353 a are associated with caches 350 c, 351 c, 352 c and 353 c, respectively.

In one approach, different subsets of bit lines can be sensed using different respective sense blocks. This allows the processing load which is associated with the sense circuits to be divided up and handled by a respective processor in each sense block. For example, a sense circuit controller 360 can communicate with the set, e.g., sixteen, of sense circuits and latches. The sense circuit controller may include a pre-charge circuit 361 which provides a voltage to each sense circuit for setting a pre-charge voltage. In one possible approach, the voltage is provided to each sense circuit independently, e.g., via the data bus 303 and a local bus such as LBUS1 or LBUS2 in FIG. 5B. In another possible approach, a common voltage is provided to each sense circuit concurrently, e.g., via the line 305 in FIG. 5B. The sense circuit controller may also include a memory 362 and a processor 363. Further example details of the sense circuit controller and the sense circuits 350 a and 351 a are provided below.

Figure 5B:
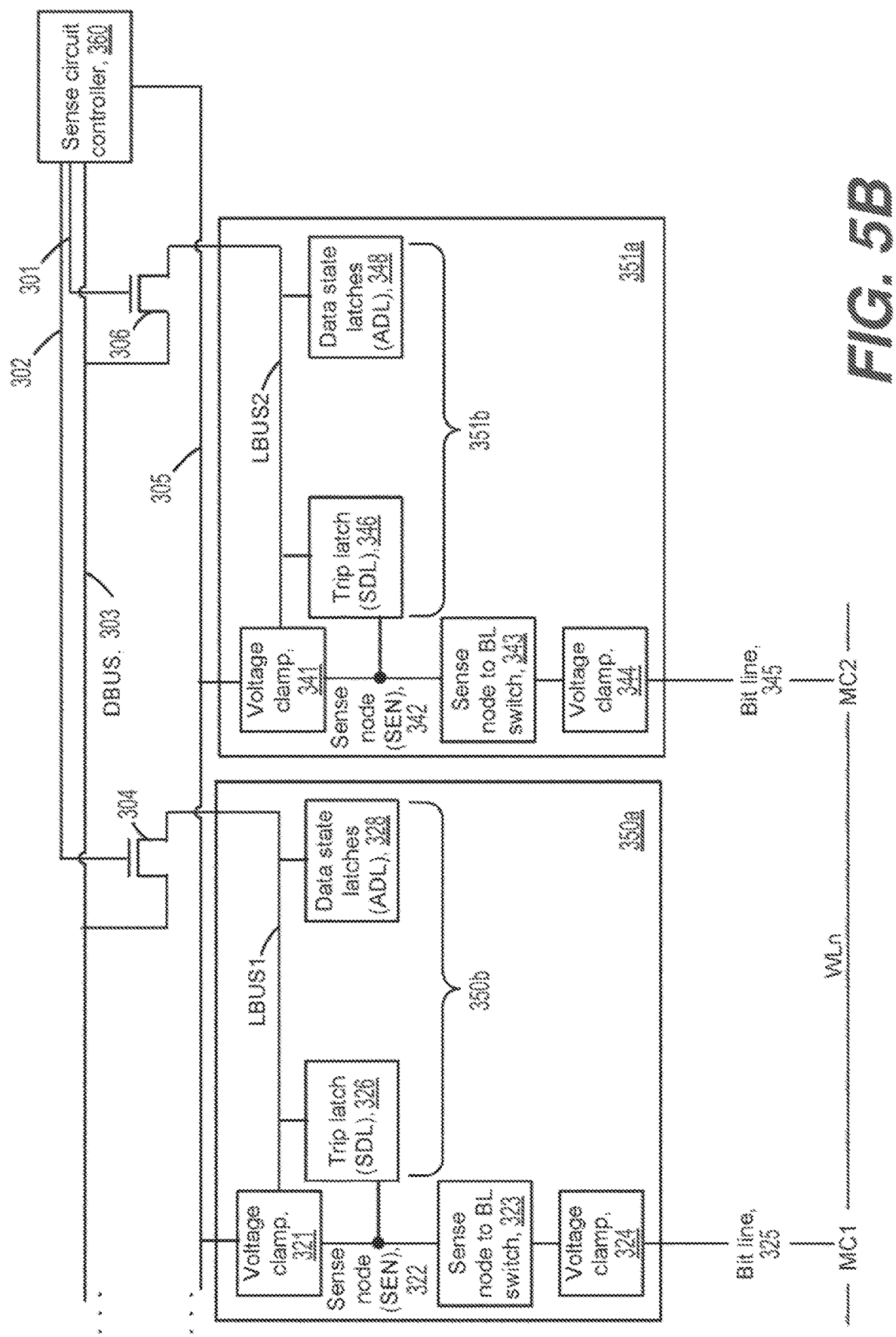
FIG. 5B depicts another example block diagram of a sense module of FIG. 1 according to aspects of the disclosure.

FIG. 5B depicts another example block diagram of a sense module 130 of FIG. 1. The sense circuit controller 360 communicates with multiple sense circuits including example sense circuits 350 a and 351 a, also shown in FIG. 5A. The sense circuit 350 a includes latches 350 b, including a trip latch 326 (SDL), and data state latches 328 (ADL, BDL, CDL). The sense circuit further includes a voltage clamp 321 such as a transistor which sets a pre-charge voltage at a sense node 322 (SEN). A sense node-to-bit line (BL) switch 323 selectively allows the sense node to communicate with a bit line 325, e.g., the sense node is electrically connected to the bit line so that the sense node voltage can decay. The bit line 325 is connected to one or more memory cells, such as a memory cell MC1. A voltage clamp 324 can set a voltage on the bit line, such as during a sensing operation or during a program voltage. A local bus, LBUS1, allows the sense circuit controller to communicate with components in the sense circuit, such as the latches 350 b and the voltage clamp in some cases. To communicate with the sense circuit 350 a, the sense circuit controller provides a voltage via a line 302 to a transistor 304 to connect LBUS1 with a data bus DBUS, 303. The communicating can include sending data to the sense circuit and/or receive data from the sense circuit.

The sense circuit controller can communicate with different sense circuits in a time-multiplexed manner, for instance. A line 305 may be connected to the voltage clamp in each sense circuit, in one approach.

The sense circuit 351 a includes latches 351 b, including a trip latch 346 (SDL) and data state latches 348 (ADL, BDL, CDL). A voltage clamp 341 may be used to set a pre-charge voltage at a sense node 342 (SEN). A sense node-to-bit line (BL) switch 343 selectively allows the sense node to communicate with a bit line 345, and a voltage clamp 344 can set a voltage on the bit line. The bit line 345 is connected to one or more memory cells such as a memory cell MC2. A local bus, LBUS2, allows the sense circuit controller to communicate with components in the sense circuit, such as the latches 351 b and the voltage clamp in some cases. To communicate with the sense circuit 351 a, the sense circuit controller provides a voltage via a line 301 to a transistor 306 to connect LBUS2 with DBUS. The lines 301 and 302 can be considered to be sense amplifier control (sac) lines.

The example memory cells MC1 and MC2 are connected to a selected word line WLn.

Figure 5C:
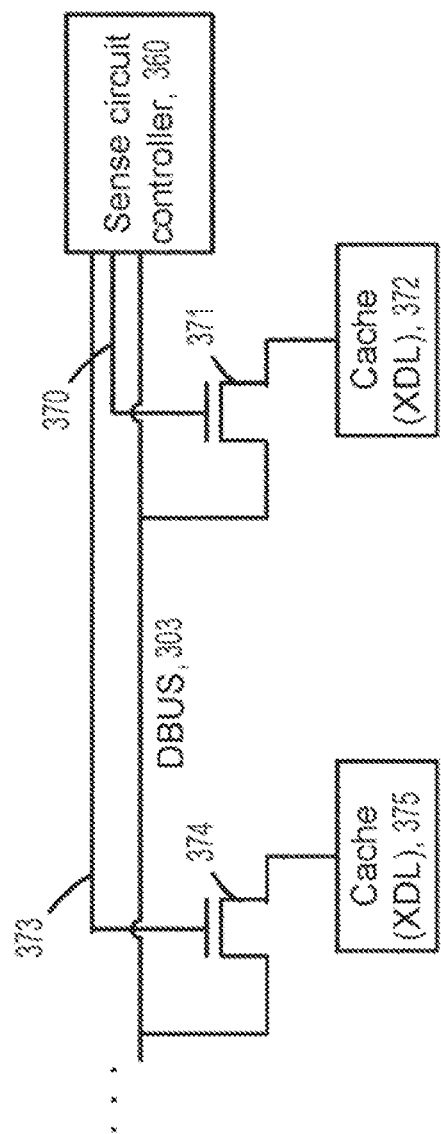
FIG. 5C depicts caches which are part of the sense block of FIG. 5B according to aspects of the disclosure.

A cache may be associated with each sense circuit and connected to DBUS as depicted in FIG. 5C.

FIG. 5C depicts caches which are part of the sense module 130 FIG. 5B. Each cache (XDL) can store a bit of data and is accessible to both the sense circuits of the column control circuitry and to input/output circuitry. During a read operation, a bit of read data can be transferred to the cache from the SDL or ADL latch of a respective sense circuit. For example, a bit of read data can be transferred to the cache 375 from the SDL latch 326 or ADL/BDL/CDL latch 328 of the sense circuit 350 a, and a bit of read data can be transferred to the cache 372 from the SDL latch 346 or ADL/BDL/CDL latch 348 of the sense circuit 351 a.

The same sense circuit controller 360 of FIG. 5B can be used to control transfers of data to and from the caches. To provide a bit transfer involving the cache 375, the sense circuit controller provides a voltage via a line 373 to a transistor 374 to connect the cache 375 to DBUS 303. To provide a bit transfer involving the cache 372, the sense circuit controller provides a voltage via a line 870 to a transistor 371 to connect the cache 372 to DBUS 303. Within a sense block or cache tier, one sense amplifier and one cache at a time can be connected to DBUS to provide a bit transfer between the sense amplifier and cache (e.g., from the sense amplifier to the cache during a read operation). The lines 370 and 373 can be considered to be cache control (cc) lines.

Figure 6:
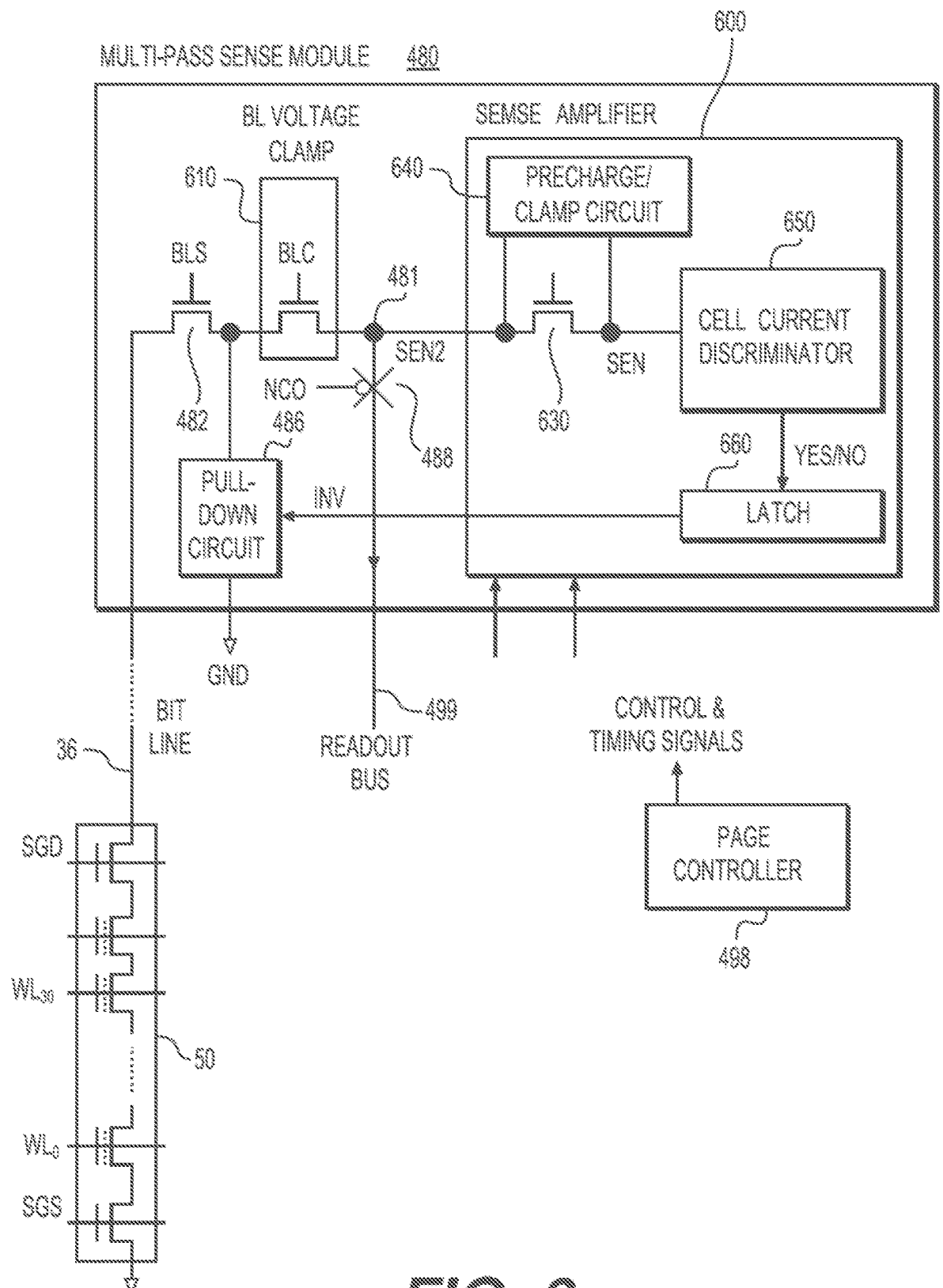
FIG. 6 is a schematic diagram illustrating one embodiment of a sense block for sensing a conduction current of a memory cell for read operations or verify operations according to aspects of the disclosure.

FIG. 6 illustrates schematically in more details an example sense module shown as sense module 130 in FIG. 1. The sense module 480 senses the conduction current of a memory cell in a NAND chain 50 via a coupled bit line 36. It has a sense node 481 that can be selectively coupled to a bit line, a sense amplifier 600 or a readout bus 499. Initially, an isolation transistor 482, when enabled by a signal BLS connects the bit line 36 via a bit line voltage clamp 610 (controlled by a signal BLC) to the sense node 481. The sense amplifier 600 senses a signal SEN2 at the sense node 481. The sense amplifier includes a precharge/clamp circuit 640, a cell current discriminator 650 and a latch 660. In this example, the NAND chain 50 has thirty-two memory cells in series with their control gates connected to word lines WL0-WL31 respectively. The NAND chain 50 is coupled to ground via a select transistor controlled by a signal SGS and coupled to the bit line 36 via a select transistor controlled by a signal SGD.

The sense module 480 enables the conduction current of the selected memory cell in the NAND chain to be sensed. Prior to sensing, the voltages to the gates of the selected memory cell must be set via the appropriate word lines and bit line. As will be described in more detail later, the precharge operation starts with the unselected word line charging to a voltage Vread followed by charging the selected world line to a predetermined threshold voltage Vt (i) for a given memory state under consideration. Then the precharged circuit 640 brings the bit line voltage to a predetermined drain voltage appropriate for sensing. This will induce a source-drain conduction current to flow in the selected memory cell in the NAND chain 50, which is detected from the channel of the NAND chain via a coupled bit line 36. The conduction current is a function of the charge programmed into the memory cell and the applied Vt (i) when there exists a nominal voltage difference between the source and drain of the memory cell.

When the Vt (i) voltage is stable, the conduction current or the programmed threshold voltage of the selected memory cell can be sensed via the coupled bit line 36. The sense amplifier 600 is then coupled to the sense node to sense the conduction current in the memory cell. The cell current discriminator 650 serves as a discriminator or comparator of current levels. It effectively determines whether the conduction current is higher or lower than a given demarcation current value I0(j). If it is higher, the latch 660 is set to a predetermined state with the signal INV=1.

A pull-down circuit 486 is activated in response to the latch 660 setting the signal INV to HIGH. This will pull down the sense node 481 and therefore the connected bit line 36 to ground voltage. This will inhibit the conduction current flow in the memory cell 10 (i.e., lock out) irrespective of the control gate voltage since there will be no voltage difference between its source and drain.

According to an aspect, there can be a page of memory cells being operated on by a corresponding number of multi-pass sense modules 480. A page controller 498 supplies control and timing signals to each of the sense modules. The page controller 498 cycles each of the multi-pass sense module 480 through a predetermined number of passes (j=1 to N) and also supplies a predetermined demarcation current value I0(j) for each pass. As is well known in the arts, the demarcation current value can also be implemented as a demarcation threshold voltage, or time period for sensing. After the last pass, the page controller 498 enables a transfer gate 488 with a signal NCO to read the state of the sense node 481 as sensed data to a readout bus 499. In all, a page of sense data will be read out from all the multi-pass modules 480. Similar sense modules have been disclosed in U.S. Pat. No. 7,046,568 granted May 16, 2006 to Cernea et al., entitled "MEMORY SENSING CIRCUIT AND METHOD FOR LOW VOLTAGE OPERATION". The entire disclosure of U.S. Pat. No. 7,046,568 is herein incorporated by reference.

Figure 7:
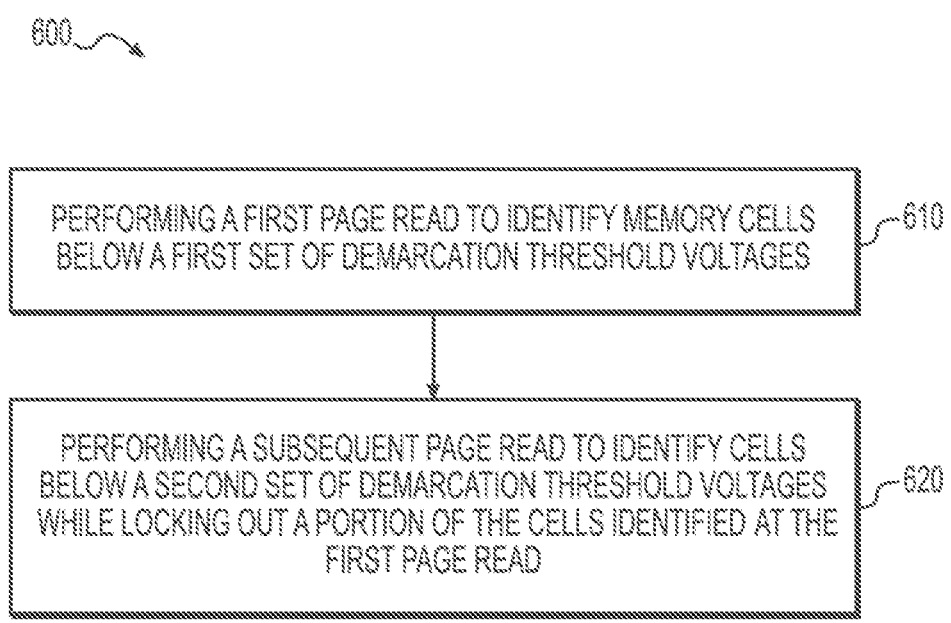
FIG. 7 is a flowchart illustrating one embodiment of a method of sensing the memory states of a memory device according to aspects of the disclosure.

FIG. 7 is a flowchart illustrating one embodiment of a method 600 of sensing a memory state of the memory cells of a memory device, such as memory device 100 of FIG. 1 and sense module 130, 480 of FIGS. 1, 5A-5C, and 6, but other memory devices and sense modules are possible.

In process 610, a first page read may be performed. The first page read includes one or more read levels of a first series of one or more demarcation threshold voltages. The first page read identifies memory cells with threshold voltages below the first series of one or more demarcation threshold voltages.

In process 620, a subsequent page read may be performed. The subsequent page read includes one or more read levels of a second series of one or more demarcation threshold voltages. The subsequent page read identifies memory cells with threshold voltages below the second series of one or more demarcation threshold voltages. During the subsequent page read, a portion of the memory cells identified at process 610 are locked out during one or more of the read levels in the subsequent page read. During the subsequent page read, a portion of the memory cells identified in a prior read level in the current page read may also be locked out during subsequent read levels in the current page read.

Peak channel current (Icc) is an important metric for the memory device or apparatus and is defined as the highest Icc level during the given operation. Thus, peak Icc is significant to the power management of the memory device or apparatus. Method 600 may be used to reduce Icc or current consumed by memory array 126 or memory die during read operations. In read operations of more than one page read, memory cells identified in a first page read may be locked out in a subsequent page read to conserve current consumed. Prior page read information alone or in combination with prior read level information in a current page read may be used to lockout additional number of memory cells during a current page read to reduce Icc during a read operation.

FIG. 8A is a read level chart 700 illustrating one embodiment of a read operation utilizing the method 600 of FIG. 7. Read level chart 700 illustrates a read operation discerning the lower bits, middle bits, and upper bits of the 8-state memory encoded with a Gray code of FIG. 4 using a 2-3-2 read scheme. The read scheme includes three pages of reads of a lower page read, a middle page read, and an upper page read. In the lower page read, two demarcation threshold voltages are provided to identify memory cells with two read levels to discern the lower bits. In the middle page read, three demarcation threshold voltages are provides to identify memory cells with three read levels to discern the middle bits. In the upper page read, two demarcation threshold voltages are provides to identify memory cells with two read levels to discern the upper bits. In the read scheme, certain memory cells in certain memory states are locked out during a read level so that power is not drained unnecessarily. Memory cells may be locked out by inhibiting the conductive cells or by having their conduction currents turned off by grounding their bit lines (or connect to SGS transistor source node value if NAND string source is set to non-zero).

FIG. 8B is a table 750 illustrating one embodiment of locking out or inhibiting conducting cells during a read level to reduce Icc during a read operation following a read scheme of read level chart 700 of FIG. 8A. The entry "c" represents non-inhibited conductive cells during a particular read level. The entry "nc" represents non-conductive cells during a particular read level. The entry "ic" represents inhibited conductive cells during a particular read level. These cells are identified based on a prior read level from the same page this is being read. The entry "eic" represents extra or additional inhibited conductive cells during a particular read level in which the extra or additional inhibited conductive cells are identified from a prior read level from a prior page read.

A lower page read comprising a two level read with a first level A read relative to demarcation of DA and a second level E read relative to demarcation threshold voltage DE, may discern the lower bits of the memory cells. In the first level A read, those memory cells with programmed threshold voltages less than the demarcation threshold voltage DA are detected. In the second level E read, those memory cells with programmed threshold voltages less than the demarcation threshold voltage DE are detected. In the second level E read, Erased state memory cells previously identified under A read from the current lower page read may be locked out during E read.

A middle page read comprising a three level read with a first level B read relative to demarcation threshold voltage of DB, a second level D read relative to demarcation threshold voltage DD, and a third level F read relative to demarcation threshold DF may discern the middle bits of the memory cells. In the first level B read, those memory cells with programmed threshold voltages less than the demarcation threshold voltage DB are detected. In the first level B read, Erased state memory cells previously identified under A read in the prior lower page read are locked out. In the second level D read, those memory cells with programmed threshold voltages less than the demarcation threshold voltage DD are detected. In the second level D read, Erased and A state memory cells previously identified under B read in the current middle page may be locked our during D read. In the third level F read, those memory cells with programmed threshold voltages less than the demarcation threshold voltage DF are detected. In the third level F read, Erased, A, B, C, and D state memory cells previously identified under E read from the prior lower page read may be locked out during F read.

An upper page read comprising a two level read with a first level C read relative to demarcation of DC and a second level G read relative to demarcation threshold voltage DG may discern the upper bits. In the first level C read, those memory cells with programmed threshold voltages less than the demarcation threshold voltage D, are detected. In the first level C read, Erased and A state memory cells previously identified under B read from the prior middle page read may be locked out during C read. In the second level G read, those memory cells with programmed threshold voltages less than the demarcation threshold voltage DG are detected. In the second level G read, Erased, A, B, C, D, and E previously detected under F read from prior middle page read may be locked out.

Locking out additional memory cells identified in a prior read level from a prior page read as compared to only locking out memory cells identified in a prior level from a current page read reduces the number of cells sensed and reduces the Icc or power consumed. Column 760 of table 750 indicates the fraction or percentage of additional memory states locked out using prior read level from a prior page read relative to the remaining conductive memory states identified simply by using a prior read level from a current page read. The additional memory states locked out are identified from a prior read level for a prior page read which could not have been identified from a prior level in a current page read.

For example, in B read in a middle page read, additional Erased state conductive memory cells may be locked out. The additional Erased state memory cells are identified from the prior lower page A read. No additional memory cells could have been identified in the current middle page read without a prior read level or a without a prior dummy read in the current middle page read. In B read, the sense operation is sensing two memory states of conducting Erased and A state memory cells if memory state information is only used from the current middle page read. In B read, the sense operation is sensing one memory state of conducting A state memory cells if Erased state memory cells identified in the prior lower page A read are locked out. Therefore, utilizing memory state information in a prior lower page A read in comparison to a current middle page read results in locking out one additional memory state out of two conducting memory states sensed in the B read.

For example, in F read in a middle page read, additional D state conductive memory cells may be locked out as well as locking out Erased, A, B, and C state conducting memory cells. The additional D state memory cells as well as Erased, A, B, and C state conducting memory cells may be identified from the lower page read E. Erased, A, B, and C state conducting memory cells could have also been identified in the prior level D read of the current middle page read. In F read, the sense operation is sensing two memory states of the conducting D and E state memory cells if only memory cells identified in the prior D level read of the current page read are locked out. In F read, the sense operation is sensing one conducting memory cell state in an E memory state if D state memory cells identified in the prior lower page E read are locked out. Therefore, utilizing memory state information in a prior lower E page read in comparison to a prior D read level in a current middle page read results in locking out one additional memory state out of two conducting memory states sensed in the F read.

For example, in C read in an upper page read, additional Erased and A state conductive memory cells may be locked out. The additional Erased and A state memory cells are identified from the middle page B read. No additional memory cells could have been identified in the current upper page read without a prior read level or without a dummy read in the current upper page read. In C read, the sense operation is sensing three memory states of the conducting Erased, A, and B state memory cells if memory state information is only used from the current upper page read. In C read, the sense operation is sensing one memory state of conducting B state memory cells if Erased and A state memory cells identified in the prior middle page B read level are locked out. Therefore, utilizing information in a prior middle page B read level in comparison to a current upper page read results in locking out two additional memory states out of the three conductive memory states sensed in the C read.

For example, in G read in an upper page read, additional C, D, and E state conductive memory cells may be locked out as well as locking out Erased, A, and B state conducting memory cells. The additional C, D, and E state memory cells as well as Erased, A, and B state conducting memory cells may be identified from the middle page F read. Erased, A, and B state conducting memory cells could have also been identified in the prior level of the current upper page C read. In G read, the sense operation is sensing four memory states of the conducting C, D, E, and F state memory cells if only memory cells identified in the current upper page read are locked out. In G read, the sense operation is sensing one conducting memory cell state in an F memory state if C, D, and E state memory cells identified in the prior middle page F read are additionally locked out. Therefore, utilizing information in a prior middle page F read in comparison to a prior C read level in a current upper page read results in locking out three additional memory states out of four conductive memory states sensed in the G read.

Figure 9:
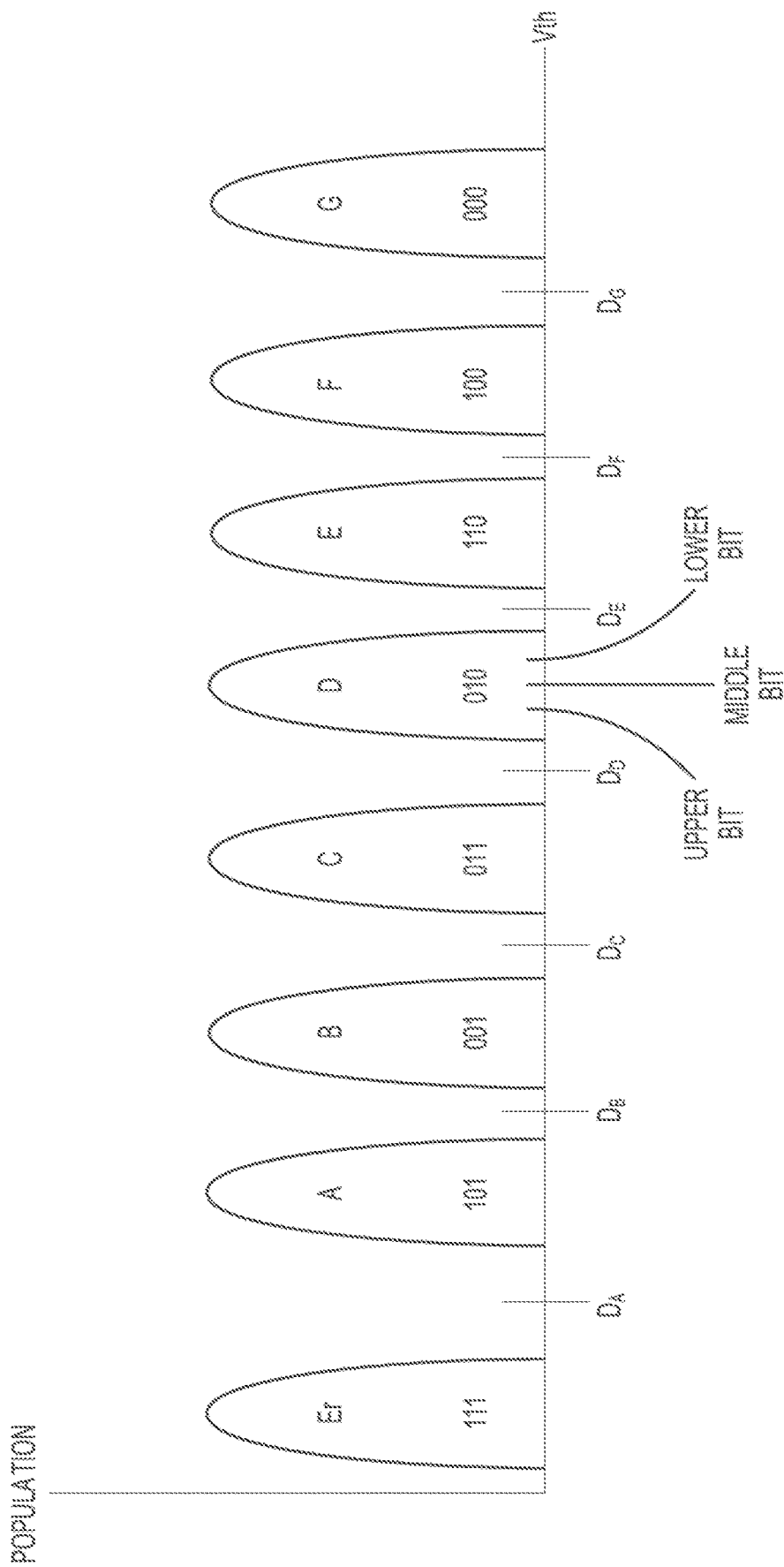
FIG. 9 is a schematic diagram illustrating another embodiment of 3-bit gray coding represented by eight memory states according to aspects of the disclosure.

FIG. 9 is a schematic diagram illustrating another embodiment of 3-bit gray coding represented by the eight memory states. In this embodiment, Erased memory state represents "111", A memory state represents "101", B memory state represents "001", C memory state represents "011", D memory state represents "010", E memory state E represents "110", F memory state represents "100", and G memory state represents "000." The 3 code bits, "lower", "middle" and "upper" bits, may be read or programmed separately. For example, in a first round, the lower bits of the memory cells may be read. In a second round, the middle bits of the memory cells may be read. In a third round, the upper bits of the memory cells may be read. Similarly in programming, in a first round the lower bits of the memory cells may be programmed and verified. In a second round the middle bits of the memory cells may be programmed and verified. In a third round the upper bits of the memory cells may be programmed and verified.

FIG. 10A is a schematic read level chart 900 illustrating one embodiment of a read operation utilizing the method 600 of FIG. 7. Read level chart 900 illustrates a read operation discerning the lower bits, middle bits, and upper bits of the 8-state memory encoded with a Gray code of FIG.

9 using a 1-3-3 read scheme. The read scheme includes three pages of reads of a lower page read, a middle page read, and an upper page read. In the lower page read, one demarcation threshold voltage is provided to identify memory cells with one read level to discern the lower bits. In the middle page read, three demarcation threshold voltages are provides to identify memory cells with three read levels to discern the middle bits. In the upper page read, three demarcation threshold voltages are provides to identify memory cells with three read levels to discern the upper bits. In the read scheme, certain memory cells in certain memory states are locked out during a read level so that power is not drained unnecessarily. Memory cells may be locked out by inhibiting the conductive cells or by having their conduction currents turned off by grounding their bit lines.

FIG. 10B is a table 750 illustrating one embodiment of locking out or inhibiting conducting cells during a read level to reduce ICC during a read operation following a read scheme of read level chart 900 of FIG. 10A. The entry "c" represents non-inhibited conductive cells during a particular read level. The entry "nc" represents non-conductive cells during a particular read level. The entry "ic" represents inhibited conductive cells during a particular read level. The entry "eic" represents extra or additional inhibited conductive cells during a particular read level in which the extra or additional inhibited conductive cells are identified from a prior read level from prior page read.

A lower page read comprising one read level with a single level D read relative to demarcation of DD may discern the lower bits of the memory cells. In the single D read, those memory cells with programmed threshold voltages less than the demarcation threshold voltage DD are detected.

A middle page read comprising a three level read with a first level A read relative to demarcation threshold voltage of DA, a second level C read relative to demarcation threshold voltage DC, and a third level F read relative to demarcation threshold DF may discern the middle bits of the memory cells. In the first level A read, those memory cells with programmed threshold voltages less than the demarcation threshold voltage DA are detected. In the first level A read, no memory cells are locked out. In the second level C read, those memory cells with programmed threshold voltages less than the demarcation threshold voltage DC are detected. In the second level C read, Erased state memory cells previously identified under A read in the current middle page may be locked our during C read. In the third level F read, those memory cells with programmed threshold voltages less than the demarcation threshold voltage DF are detected. In the third level of read F, Erased, A, B, and C state memory cells previously identified under D read from the prior lower page read may be locked out during F read.

An upper page read comprising a three level read with a first level B read relative to demarcation of DB, a second level E read relative to demarcation threshold voltage DE, and a third level G read relative to demarcation of DG may discern the upper bits. In the first level B read, those memory cells with programmed threshold voltages less than the demarcation threshold voltage DB are detected. In the first level B read, Erased state memory cells previously identified under A read from the prior middle page read may be locked out during B read. In the second level E read, those memory cells with programmed threshold voltages less than the demarcation threshold voltage DE are detected. In the second level E read, Erased, A, B, and C state memory cells previously detected under D read from prior lower page read may be locked out. In the third level G read, those memory cells with programmed threshold voltages less than the demarcation threshold voltage DG are detected. In the third level G read, Erased, A, B, C, D, and E previously detected under F read from prior middle page read may be locked out.

Locking out additional memory cells identified in a prior read level from a prior page read as compared to locking out memory cells identified in a prior level from a current page reduces the number of cells sensed and reduces the Icc or power consumed. Column 960 of table 950 indicates the fraction or percentage of additional memory states locked using prior read level from a prior page read relative the remaining conductive states identified simply by using a prior read level from current page read. The additional memory states locked out are identified from a prior read level which could not have been identified from a prior level in a page read.

For example, in F read in a middle page read, additional C state conductive memory cells may be locked out as well as locking out Erased, A, and B state conducting memory cells. The additional C state memory cells as well as Erased, A, and B state conducting memory cells may be identified from the lower page D read. Erased, A, and B state conducting memory cells could have also been identified in the prior level C read of the current middle page read. In F read, the sense operation is sensing three memory states of the conducting C, D, and E state memory cells if only memory cells identified in the prior C level read of the current page read are locked out. In F read, the sense operation is sensing two conducting memory cell states in a D or E memory state if addition C state memory cells identified in the prior lower page D read are locked out. Therefore, utilizing memory state information in a prior lower page D read in comparison to a prior C read level in a current middle page read results in locking out one additional memory state out of three conducting memory states sensed in the F read.

For example, in B read in an upper page read, additional conductive memory cells in Erased memory states may be locked out. The additional Erased state memory cells are identified from the middle page A read. No additional memory cells could have been identified in the current upper page read without a prior read level or a without a prior dummy read in the current middle page read. In B read, the sense operation is sensing two memory states of conducting Erased and A state memory cells if memory state information is only used from the current upper page read. In B read, the sense operation is sensing one memory state of conducting A state memory cells if Erased state memory cells identified in the prior middle page A read are locked out. Therefore, utilizing memory state information in a prior middle page A read in comparison to a current upper read results in locking out one additional memory state out of two conducting memory states sensed in the B read.

For example, in E read in an upper page read, additional B and C state conductive memory cells may be locked out as well as locking out Erased and A state conducting memory cells. The additional B and C state memory cells as well as Erased and A state conducting memory cells may be identified from the lower page D read. Erased and A state conducting memory cells could have also been identified in the prior level of the current upper page B read. In E read, the sense operation is sensing three memory states of the conducting B, C, and E state memory cells if only memory cells identified in the current upper page B read level are locked out. In E read, the sense operation is sensing one memory state of conducting D state memory cells if additional B and C state memory cells identified in the prior lower page D read are additionally locked out. Therefore, utilizing information in a prior lower page D read in comparison to a prior B read level in a current upper page read results in locking out two additional memory states out of three conductive memory states sensed in the E read.

For example, in G read in an upper page read, additional E state conductive memory cells may be locked out as well as locking out Erased, A, B, C, and D state conducting memory cells. The additional E state memory cells as well as Erased, A, B, C, and D state conducting memory cells are identified from the middle page F read. Erased, A, B, C, and D state conducting memory cells could have also been identified in the prior level of the current upper page E read. In G read, the sense operation is sensing two memory states of the conducting E and F state memory cells if only memory cells identified in the current upper page E read level are locked out. In G read, the sense operation is sensing one conducting memory cell state in an F memory state if additional E state memory cells identified in the prior middle page F read are additionally locked out. Therefore, utilizing information in a prior middle page F read in comparison to a prior E read level in a current upper page read results in locking out one additional memory states out of two conductive memory states sensed in the G read.

Figure 11:
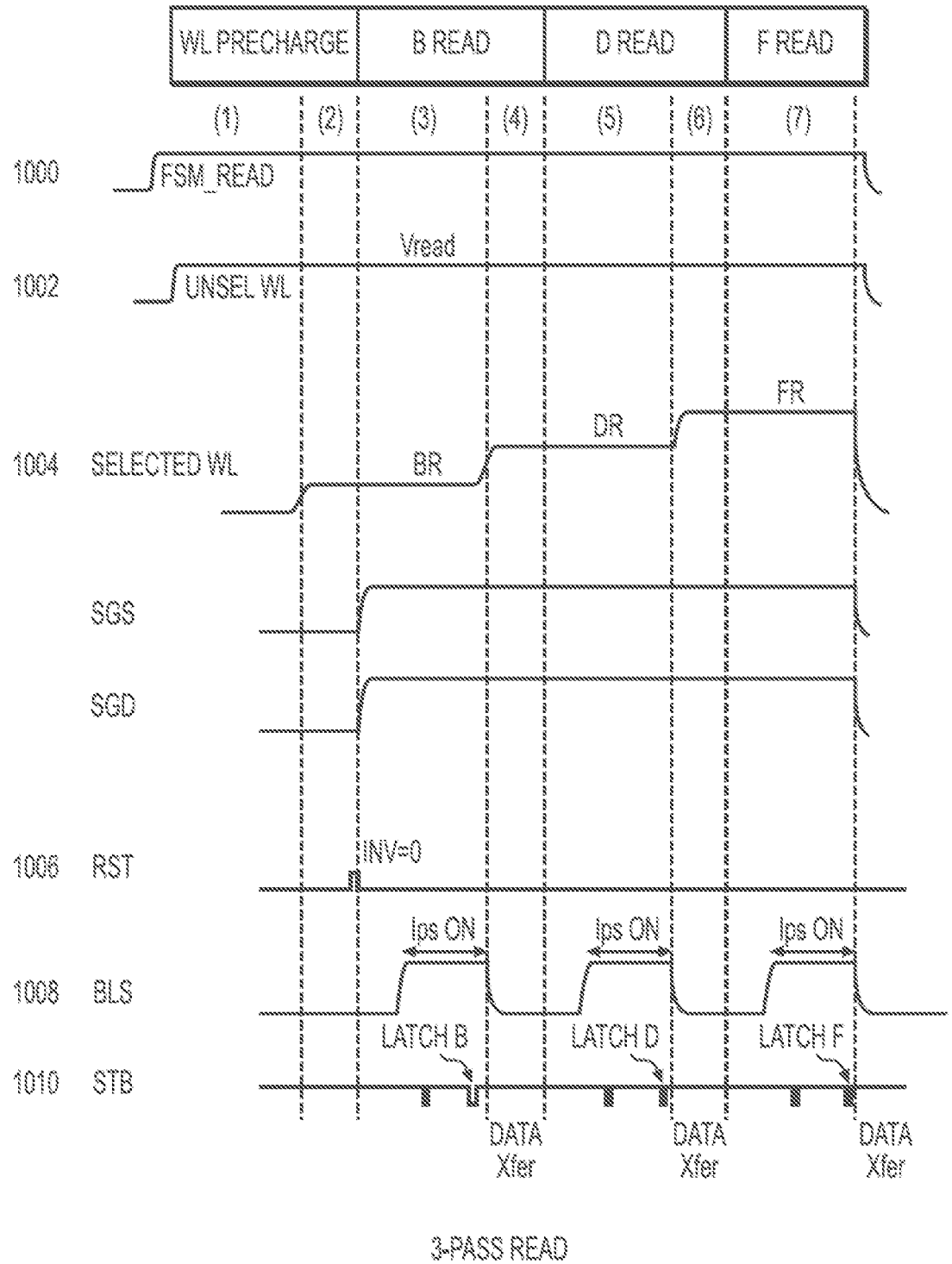
FIG. 11 is a timing diagram that illustrates the operation of the sense module shown in FIG. 6 during the 3-pass read as applied to a NAND memory cell that is part of a memory page in parallel according to aspects of the disclosure.

FIG. 11 shows timing diagrams of the operation of the sense module 130, 480 shown in FIGS. 1, 5A-5C, and 6 during the 3-pass read as applied to a NAND memory cell that is part of a memory page in parallel, but other timing, and sense modules are possible. The timing diagram will be described in reference to middle page read of the 2-3-2 read scheme of FIGS. 8A-8B. This example shows a 3-level read of B read, D read, and F read relative to demarcation threshold voltage of DB, demarcation threshold voltage DD, and demarcation threshold DF respectively. At the beginning of each read level, the memory cells which are not locked out will have their bit lines selected for precharged. The locked out memory cells will be discharged to ground. Selected word lines signal are supplied a voltage to the control gate of the selected cell in the NAND string to set a demarcation threshold voltage, such as a demarcation threshold voltage DB in anticipation of the B read suboperation. A strobe signal STB enables a latching of the results of the read suboperation.

FIG. 11 shows the read operation to be divided into seven phases, with phases (1) and (2) grouped under a world line precharge suboperation, followed by phases (3) and (4) under B read, phases (5) and (6) under D read and phase (7) under F read suboperations respectively. Reference numeral 1000 shows that the read operation is timed at the start and end by the FSM_READ signal rising and falling respectively.

The world line precharge suboperation begins at phase (1) with the unselected word lines of the NAND chain precharging with the rise of the Unsel WL signal as shown with reference numeral 1002. This supplies a voltage of Vread (e.g. 5.5V) to the control gates of the unselected cells in the NAND chain in order to turn them fully on. At phase (2), the selected word line of the NAND chain begins precharging with the rise of the Selected WL signal as shown with reference numeral 1004. This supplies a voltage BR to the control gate of the selected cell in the NAND chain and effectively sets the demarcation threshold voltage DB in anticipation of the B read suboperation to follow.

The B read suboperation begins at phase (3) with the signal RST resetting the sense amplifier's output signal INV to zero (reference numeral 1006). At the same time, the NAND chain is enabled for connection to the bit line by the signals SGS and SGD turning on a pair of select transistors of the NAND chain. The bit line is then coupled to the sense module by an enabling signal BLS (reference numeral 1008). At that moment, the precharge/clamp circuit 640 in the sense module charges up the bit line to a predetermined voltage (e.g. 0.5V) against a draining conduction current, IDs, of the memory cell (shown as "Ips ON" in reference numeral 1008). As soon as the bit line voltage is stable, a strobe signal STB enables a latching of the result of the cell current discriminator 650 into the latch 660 (shown as "Latch B" or "Latch D" or "Latch F" in reference numeral 1010). If the programmed threshold voltage of the memory cell is less than that of the demarcation threshold DB, (or equivalently, the cell's conduction current is higher than a demarcation current) the node SEN or SEN2 will be drained down to LOW by the conduction current. This will result in a latch result with an INV signal at HIGH. Conversely, if the programmed threshold voltage of the memory cell is higher than DB, SEN2 will be detected to be HIGH and INV will be latched LOW. As soon as the data from the sense amplifier is latched, the signal BLS goes LOW, thereby disconnecting the memory cell from the sense module.

For those higher current memory cells where the sensing results in the signal INV being latched at HIGH, a pull-down circuit 486 pulls down their bit lines to ground. This effectively turns off the conduction currents and the power drain of those memory cells. In a preferred implementation, an additional earlier reading (see first strobe STB in phase (3) of reference numeral 1010) is made by the sense amplifier with a limited bit line pull-up. This will identify those memory cells with even higher conduction current states and have their bit lines latched to ground as soon as possible in order to turn off their conduction currents.

In phase (4), the data in the SEN2 is transferred out via the readout bus 499 when the transfer gate 488 is enabled by the signal NCO. This is denoted by "Data Xfer" in FIG. 11.

The suboperations D read and F read are each similar to that of B read, with corresponding shifting of the selected WL voltage to DR and FR respectively.

According to an aspect, it may be preferable to sense progressively from the lower threshold voltage (such as from state "B"). This means the higher current cells are identified first for early disposal. If the cell has a programmed threshold voltage less than DB, it is regarded as a conducting cell. The conducting cell will be discharged to ground after sensing at "B". This effectively turns off the conduction current in the cell. If the cell has a programmed threshold voltage higher than DB, then it is regarded as non-conducting at "B" and the bit line will be kept at a constant value and not discharged. For the second suboperation of sensing at "D" level, only the bit lines of the non-conducting cells at "B" need be selectively charged up. This means that the sense module latches for the page are not reset to force INV back to zero (i.e., not reset to clear the bit line pulldown with INV=1). In this way, the cells which have a programmed threshold voltage less than DB will not be charged up, thereby saving power. It will be seen that with each successive sensing, more and more of the memory cell in the page are turned off as they are irrelevant to subsequent sensing. In this way, the power drained by the memory cells in the page is minimized.

While the example described refers to a read operation involving three demarcation threshold voltages, the methods and principle described are generally applicable to read operations with more than one pass where subsequent passes can take advantage of information obtained in an earlier pass to selectively turn off the cells irrelevant to the current pass. It should also be noted that in conventional implementations, the sensing relative to each memory state is independent of each other. That is, each sensing will go through exactly same number of steps, i.e., from phase (1) to phase (4) for each of B read, D read and F read. In the present sensing, only the first read pass, B read will reset all the sense amplifier's latches of the page to INV=0 in order to precharge all the bit lines in the page. Subsequent sensing will only charge up those bit lines with INV=0 while not charging those bit lines that have their INV's flipped during previous sensing.

In certain embodiments, the term identifying memory cells in a read level may include those memory cells that are locked out since those memory cells should have been identified in the read level. In certain embodiments, it is understood that locking out memory cells in a read level may utilize information or latches from one or more prior read levels from a prior page read alone or in combination with a current page read.

As discussed, memory cells may have threshold voltage windows partitioned into several regions representing several memory states. The regions are demarcated by the set of demarcation threshold voltages. Comparing the programmed threshold voltage with a plurality of demarcation threshold voltages when sensing a memory cell determines in which region the programmed threshold voltage lies. At a subsequent page read, the memory cells with programmed threshold voltages lower than the current demarcation threshold voltage can be identified from a prior page read and can be locked out. Thus, turning-off or inhibiting the conduction current of the previously identified memory cells from prior page reads (alone or in combination with previously identified memory cells form a prior read level from a current page read) reduces the current and power consumed.

Figure 12:
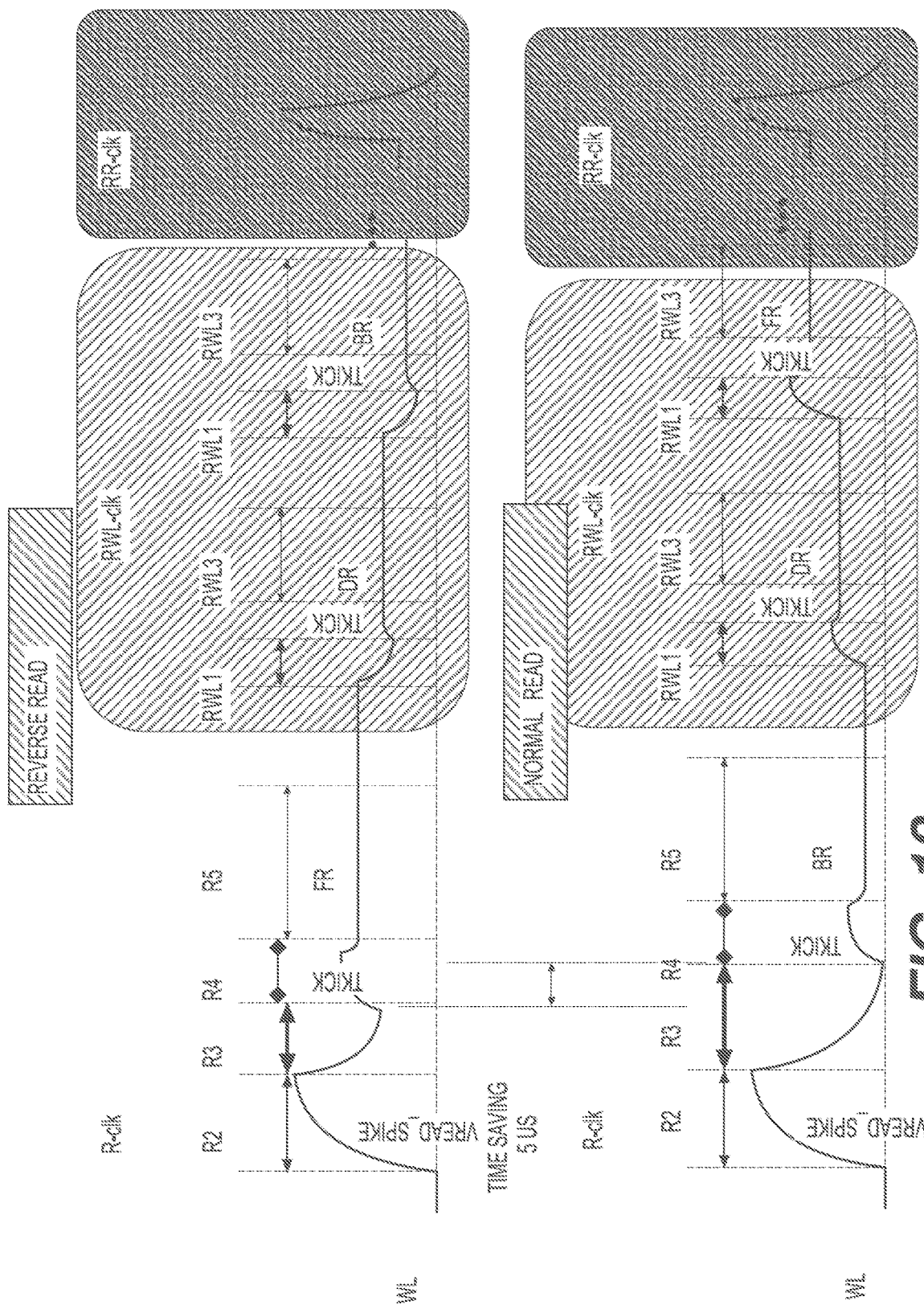
FIG. 12 shows an example series of read voltages applied to a selected word line for both a normal read and a reverse read when reading a middle page according to aspects of the disclosure.

FIG. 12 shows an example series of read voltages applied to a selected word line for both a normal read and a reverse read when reading a middle page. Various time periods or portions of the period of time in which the read operation occurs are shown. These time periods include a first verify stage R-clk, a second program-verify stage RWL-clk, and a discharge stage RR-clk. The first verify stage R-clk is further divided into periods including a second portion R2, third portion R3, fourth portion R4, and settling period R5 of the first verify stage R-clk. Similarly, the second program-verify stage RWL-clk can include periods RWL1 and RWL3. In addition, a "kicking voltage" (i.e., an overshoot or undershoot of the voltage) may be applied to the selected word line in the time period labeled Tkick (e.g., during R4 and between RWL1 and RWL3) to help the voltage on the selected word line reach the target or reference voltage more quickly. As shown, for the normal read (upper portion of FIG. 12), the series of read voltages become increasing higher in magnitude with each successive data state that is being sensed. In contrast, for the reverse order read or reverse read (lower portion of FIG. 12), the read voltages of the series become increasing lower in magnitude with each successive data state that is being sensed. FIG. 13 is a table illustrating the sequences of the data states being sensed for each of a lower page, middle page, and upper page for both the normal read and the reverse read.

Figure 14:
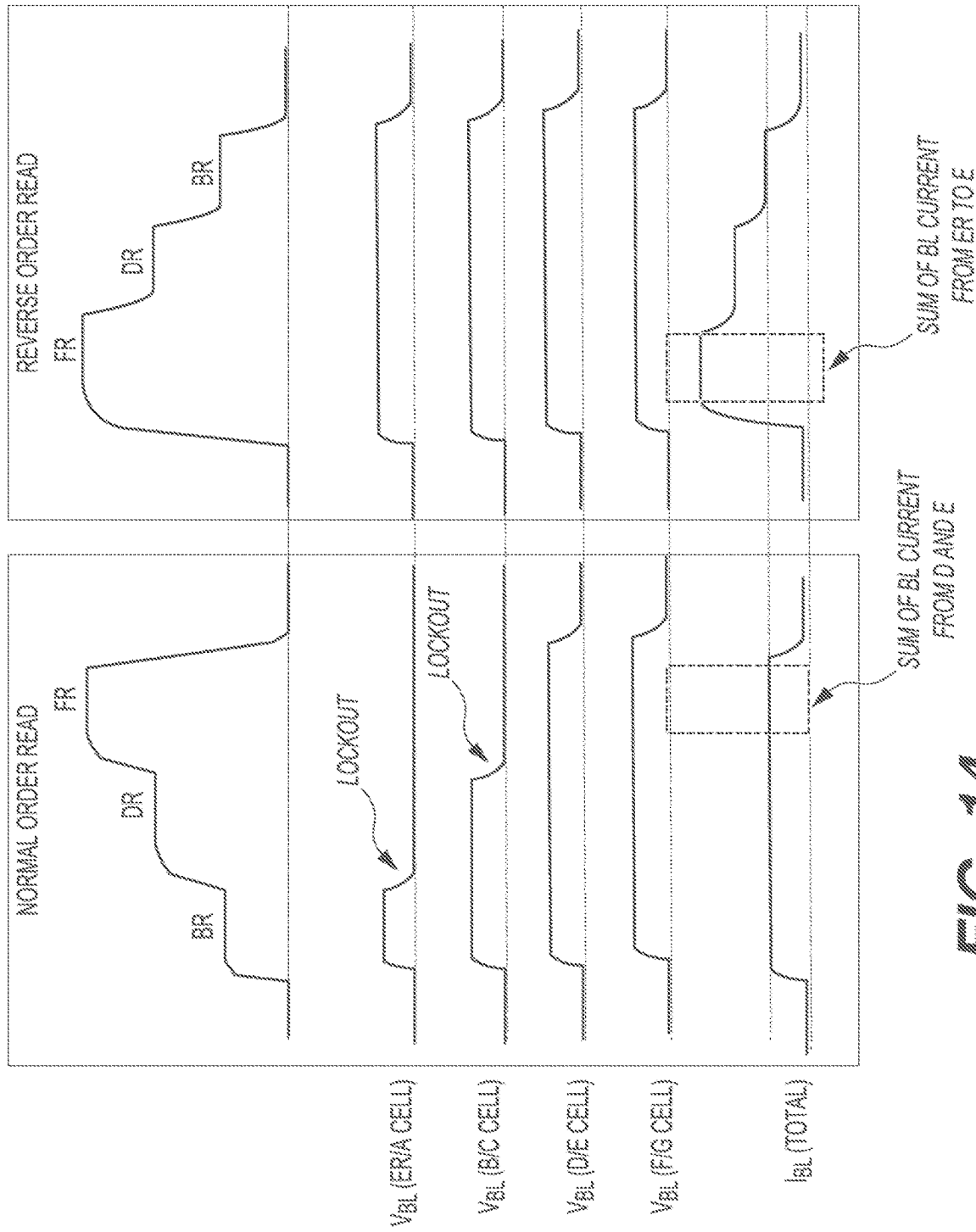
FIG. 14 shows a plot of the voltages applied to the word lines, the bit lines coupled to memory cells targeted for various data states during portions of a normal read and a reverse read along with overall combined current of all of the bit lines according to aspects of the disclosure.

As previously discussed, the reverse read can improve the speed of the read operation, but is not compatible with the lockout mode. In the normal read, the CG voltage or voltage applied to the word lines increases to read different states. FIG. 14 shows a plot of the voltages applied to the word lines (top of FIG. 14), the bit lines ($V_{BL}$) coupled to memory cells targeted for various data states during portions of a normal read and a reverse read along with overall combined current of all of the bit lines. An example of lockout in normal read is shown on the left hand side of FIG. 14. During the read of the B memory or data state or B read (BR), The memory cells targeted for the erase state or A memory state (Er/A cells) can be determined because only Er/A cells are conducting current in BR, so it can be locked out in the higher state read to reduce current, for example. In the reverse order read (right hand side of FIG. 14) the high threshold voltage Vt level is read first, so the high threshold voltage Vt memory cell will not be conducting in the next read. Specifically, as shown, in the reverse order read, the CG read state voltage is applied in reverse order. In this way, in the F state read (FR), only the memory cells targeted for the F/G states are determined. Then, in the later D memory or data state read (DR), memory cells targeted for the F/G states will not conduct current, so no need to be locked out. Comparing the normal order read and reverse order read, during the FR, normal order read will only have memory cells targeted for the D/E memory or data states conducting bit line current. While in the reverse order read, memory cells targeted for Er/A/B/C/D/E states are conducting current and this leads to high current consumption (Icc). Thus, the lock out mode cannot save bit line current ion the reverse order read.

Consequently, described herein is a memory apparatus (e.g., memory device 100 of FIG. 1) including memory cells (e.g., memory cell 10 of FIG. 2) each connected to one of a plurality of word lines (e.g., WL0-WL31 of FIG. 6) and disposed in memory holes (e.g., NAND chain 50 of FIG. 6) each connected to one of a plurality of bit lines (e.g., coupled bit line 36 of FIG. 6). The memory cells are configured to retain a threshold voltage Vth or Vt corresponding to one of a plurality of data states (see e.g., FIG. 4 or FIG. 9). A control means (e.g., one or any combination of control circuitry 110, read/write circuits 128, decoders 124 and 132, source control circuits 127, controller 122 of FIG. 1, sense circuit controller 360 of FIG. 5A and so forth) is coupled to the plurality of word lines and the plurality of bit lines and is configured to apply a bit line voltage to the plurality of bit lines while reading the memory cells to determine whether the memory cells have the threshold voltage above one or more of a plurality of read levels (e.g., demarcation threshold voltages, DA, DB, DC, DD, DE, DF, and DG of FIG. 4 or 9) associated with each of the plurality of data states in a first portion of a read operation. The control means is also configured to group the memory cells targeted for ones of the plurality of data states into a plurality of data state groups based on the first portion of the read operation. The control means is additionally configured to supply a near zero voltage to the plurality of bit lines (e.g., ground the bit lines) coupled to the memory cells targeted for ones of the plurality of data states associated with at least one of the plurality of data state groups while reading the memory cells targeted for one or more of the plurality of data states in subsequent portions of the read operation. According to an aspect, the read operation is a reverse order read.

As discussed above, the memory cells can comprise a plurality of pages each storing a plurality of bits of data stored in the memory apparatus. The plurality of bits can include a lower bit associated with a lower page of the plurality of pages (e.g., lower bit indicated in FIG. 4 or 9). The one or more of the plurality of read levels associated with each of the plurality of data states in the first portion of the read operation can include the plurality of read levels corresponding to the plurality of data states used to discern the lower bit of each of the memory cells (e.g., memory cells targeted for the Er/E/F/G data states). Thus, according to an aspect, the control means is further configured to read the memory cells to determine whether the memory cells have the threshold voltage above the plurality of read levels corresponding to the plurality of data states used to discern the lower bit of each of the memory cells in the first portion of the read operation. The control means is also configured to read the memory cells to determine whether the memory cells have the threshold voltage above the plurality of read levels corresponding to the plurality of data states used to discern the plurality of bits of the data of each of the memory cells other than the lower bit in the subsequent portions of the read operation.

With reference back to FIGS. 4 and 9, the plurality of data states may include, in order of the threshold voltage increasing in magnitude, an erased state, a plurality of programmed data states (e.g., A-G data states). As discussed, the memory apparatus can further include a plurality of data state latches including a lower bit latch ADL (e.g., ADL or data state latches 328 of FIG. 5B) configured to store the lower bit for the lower page of the data. So, the control means is further configured to group the memory cells targeted for ones of the plurality of data states into the plurality of data state groups (e.g., memory cells targeted for the Er/E/F/G data states (ADL=1) and memory cells targeted for the A/B/C/D data states (ADL=0)) based on the lower bit latch ADL. The control means applies the bit line voltage to the plurality of bit lines coupled to the memory cells targeted for each of the plurality of data states corresponding to the lower bit latch ADL storing a zero while reading the memory cells targeted for each of the plurality of data states corresponding to the lower bit latch ADL storing a zero in the subsequent portions of the read operation. The control means supplies the near zero voltage to the plurality of bit lines coupled to the memory cells targeted for each of the plurality of data states corresponding to the lower bit latch ADL storing a one while reading the memory cells targeted for each of the plurality of data states corresponding to the lower bit latch ADL storing a one in the subsequent portions of the read operation.

So, instead of pre-charging all of the bit lines coupled to memory cells, the current consumption can be reduced by pre-charging the bit lines selectively based on the lower page (LP) read information. After the LP read, the memory cell can be categorized into two groups: (a) Er cell E/F/G cells and (b) A/B/C/D cells. This information can be used in the later middle page (MP)/upper page (UP) read to selectively pre-charge the bit lines. FIG. 15 shows a plot of the voltages applied to the word lines (top of FIG. 15), the bit lines ($V_{BL}$) coupled to memory cells targeted for various data states during a lower page portion, middle page portion, and upper page portion of a reverse order read operation along with overall combined current of all of the bit lines for both a current reverse order read (without the selective pre-charging as described above, indicated as current) and using selective pre-charging of the bit lines based on the lower page read information (indicated as proposal 1). FIG. 16 is a table summarizing the bit line current components for each data state of the LP, MP, and UP reads for both the current reverse order read (without the selective pre-charging as described above, indicated as current) and using selective pre-charging of the bit lines based on the lower page read information (indicated as proposal 1). During the MP read memory cells targeted for A to D data states do not need to be sensed during the read of the F data state read (FR), so during the FR, the bit line voltage or level of the bit lines coupled to memory cells targeted for the A to D data states can be grounded. In other words, during the middle and upper page read, the only bit lines that are pre-charged are those coupled to memory cells in which the first page latch ADL=1. The bit lines coupled to the memory cells targeted for the A to D cells will be pre-charged during the later D data state read (DR) and B data state read (BR). In this way, read Icc can be reduced by reducing the part of unnecessary conducting bit lines. The same approach can be used for the UP read.

As discussed, the plurality of bits can further include a middle bit associated with a middle page of the plurality of pages (e.g., middle bit indicated in FIG. 4 or 9) and an upper bit associated with an upper page of the plurality of pages (e.g., upper bit indicated in FIG. 4 or 9). Referring back to FIG. 5B for example, the plurality of data state latches includes a trip latch SDL (e.g., SDL of FIG. 5B) coupled to the plurality of data state latches (e.g., data state latches 328) and a voltage clamp (e.g., voltage clamp 321) configured to set the bit line voltage at a sense node SEN (e.g., sense node 342) and a cache XDL (e.g., cache 372, 375 of FIG. 5C) configured to store one bit of the data from the control means. Again, the first portion of the read operation includes a lower page read to determine the lower bit of the memory cells. The subsequent portions of the read operation can include a middle page read to determine the middle bit of the memory cells and an upper page read to determine the upper bit of the memory cells.

FIGS. 17-21 show levels or contents of the cache XDL, lower bit latch ADL, trip latch SDL, sense node SEN for each of the plurality of data states for LP, MP, and UP reads for both the current reverse order read (without the selective pre-charging as described above, indicated as current) and using selective pre-charging of the bit lines based on the lower page read information (indicated as proposal 1). As shown, according to an aspect, the control means is further configured to set the trip latch SDL equal to one, set the sense node SEN equal to one, set the sense node SEN equal to the sense node SEN logically anded with the trip latch SDL, set the trip latch SDL to be logically not the sense node SEN logically anded with the trip latch SDL, set the sense node SEN equal to one, set the sense node SEN to equal to the sense node SEN logically anded with the trip latch SDL, set the trip latch SDL equal to logically not the sense node SEN, and set the cache XDL equal to the trip latch SDL in the lower page read. The control means is also configured to set the trip latch SDL equal to the lower bit latch ADL, set the sense node SEN equal to one, set the sense node SEN equal to the sense node SEN logically anded with the trip latch SDL, set the trip latch SDL to be logically not the sense node SEN logically anded with the trip latch SDL, set the sense node SEN equal to one, set the sense node SEN to equal to the sense node SEN logically anded with the trip latch SDL, set the trip latch SDL equal to logically not the sense node SEN, set the sense node SEN equal to one, set the sense node SEN equal to the sense node SEN logically anded with the trip latch SDL, set the trip latch SDL equal to not the sense node SEN, and set the cache XDL equal to the trip latch SDL in the middle page read. The control means is further configured to set the trip latch SDL equal to the lower bit latch ADL, set the sense node SEN equal to one, set the sense node SEN equal to the sense node SEN logically anded with the trip latch SDL, set the trip latch SDL to be logically not the sense node SEN logically anded with the trip latch SDL, set the sense node SEN equal to one, set the sense node SEN to equal to the sense node SEN logically anded with the trip latch SDL, set the trip latch SDL equal to logically not the sense node SEN, and set the cache XDL equal to the trip latch SDL in the upper page read. It should be appreciated that the plurality of data states can be grouped differently than described above or into more than to groups, for example.

Again, with reference back to FIGS. 4 and 9, the plurality of data states may include, in order of the threshold voltage increasing in magnitude, an erased state, a plurality of programmed data states (e.g., A-G data states). According to an aspect, the plurality of data states can be grouped into a plurality of data state groups including, in order of the threshold voltage increasing in magnitude, an erased data state group and a first programmed data state group and a second programmed data state group. According to another aspect, the erased data state group comprises the erased state, the first programmed data state group includes the memory cells targeted for the A/B/C/D data states, the second programmed data state group includes the memory cells targeted for the E/F/G data states. Thus, the control means may be further configured to group the memory cells targeted for ones of the plurality of data states into the plurality of data state groups based on relative magnitudes of the threshold voltage. The control means can then supply the near zero voltage to the plurality of bit lines coupled to the memory cells targeted for the erased data state group while reading the memory cells in the subsequent portions of the read operation. The control means is also configured to apply the bit line voltage to the plurality of bit lines coupled to the memory cells targeted for each of the plurality of data states in the first programmed data state group and the second programmed data state group while reading the memory cells targeted for each of the plurality of data states in the first programmed data state group in the subsequent portions of the read operation. In addition, the control means is configured to supply the near zero voltage to the plurality of bit lines coupled to the memory cells targeted for each of the plurality of data states in the first programmed data state group while reading the memory cells targeted for each of the plurality of data states in the second programmed data state group in the subsequent portions of the read operation.

Therefore, instead of pre-charging all the bit lines connected to all of the memory cells, the read current consumption Icc can be reduced by pre-charging the bit lines selectively using the LP information similar the selective pre-charging of the bit lines based on the lower page read information described above (proposal 1). After the LP read, the memory cells can be categorized into three groups, instead of the two groups described above: (a) Er cell; (b) A/B/C/D cell (c) E/F/G cell. This information can be used in the later MP/UP read to selectively pre-charge the bit lines. FIG. 22 shows a plot of the voltages applied to the word lines (top of FIG. 22), the bit lines ($V_{BL}$) coupled to memory cells targeted for various data states during a lower page portion, middle page portion, and upper page portion of a reverse order read operation along with overall combined current of all of the bit lines for both a current reverse order read (without the selective pre-charging as described above, indicated as current) and using another selective pre-charging of the bit lines based on the lower page read information (indicated as proposal 2). FIG. 23 is a table summarizing the bit line current components for each data state of the LP, MP, and UP reads for both the current reverse order read (without the selective pre-charging as described above, indicated as current) and using another selective pre-charging of the bit lines based on the lower page read information (indicated as proposal 2). During the MP read, memory cells targeted for the erase state (Er) will not be sensed and their bit lines will not be pre-charged, memory cells targeted for A to D data states do not need to be sensed during the read of the F data state read (FR), so during the FR, the bit line voltage or level of the bit lines coupled to memory cells targeted for the A to D data states can be grounded. So, only the memory cells with the lower bit latch ADL=0 (E/F/G data states) are precharged and sensed in FR. The bit lines coupled to the memory cells targeted for the A to E cells will be precharged during the later D data state read (DR) and B data state read (BR). So, only the memory cells with the middle bit latch BDL=1 and not passed FR (cells targeted for A to E data states) are pre-charged and sensed in DR and only the memory cells with the middle bit latch BDL=1 and not passed DR (cells targeted for A to C data states) are pre-charged and sensed in BR In this way, read Icc can be reduced by reducing the part of unnecessary conducting bit lines. The same approach can be used for the UP read.

As discussed, the plurality of bits can further include a middle bit associated with a middle page of the plurality of pages (e.g., middle bit indicated in FIG. 4 or 9) and an upper bit associated with an upper page of the plurality of pages (e.g., upper bit indicated in FIG. 4 or 9). Referring back to FIG. 5B for example, the memory apparatus further includes a plurality of data state latches including the lower bit latch ADL configured to store the lower bit for the lower page of the data, a middle bit latch BDL (e.g., data state latches 328 of FIG. 5B) configured to store the middle bit for the middle page of the data and an upper bit latch CDL (e.g., data state latches 328 of FIG. 5B) configured to store the upper bit for the upper page of the data. The plurality of data state latches includes a trip latch SDL (e.g., SDL of FIG. 5B) coupled to the plurality of data state latches (e.g., data state latches 328) and a voltage clamp (e.g., voltage clamp 321) configured to set the bit line voltage at a sense node SEN (e.g., sense node 342) and a cache XDL (e.g., cache 372, 375 of FIG. 5C) configured to store one bit of the data from the control means. Again, the first portion of the read operation includes a lower page read to determine the lower bit of the memory cells. The subsequent portions of the read operation can include a middle page read to determine the middle bit of the memory cells and an upper page read to determine the upper bit of the memory cells. Here, the lower and middle bit latches ADL/BDL are used during the LP read to store the three groups information for later MP read and UP read.

FIGS. 24-27 show levels or contents of the cache XDL, lower bit latch ADL, trip latch SDL, sense node SEN for each of the plurality of data states for LP, MP, and UP reads for both the current reverse order read (without the selective pre-charging as described above, indicated as current) and using another selective pre-charging of the bit lines based on the lower page read information (indicated as proposal 2). As shown, according to an aspect, the control means is further configured to set the trip latch SDL equal to one, set the sense node SEN equal to one, set the sense node SEN equal to the sense node SEN logically anded with the trip latch SDL, set the trip latch SDL to be logically not the sense node SEN logically anded with the trip latch SDL, set the trip latch SDL equal to one, set the sense node SEN to equal to the sense node SEN logically anded with the trip latch SDL, set the trip latch SDL equal to or less than the sense node SEN, and set the trip latch SDL equal to the lower bit latch ADL logically anded with the sense node SEN in the lower page read. Setting the trip latch SDL SDL equal to ~ADL (not ADL) will select cells targeted for the E/G/F data states during FR and GR. Setting the trip latch SDL SDL equal to BDL will select cells targeted for A/C/D/E/G/F during DR/BR/CR reads. The control means is also configured to set the trip latch SDL equal to logically not the lower bit latch ADL, set the sense node SEN equal to one, set the sense node SEN equal to the sense node SEN logically anded with the trip latch SDL, set the trip latch SDL to be logically not the sense node SEN logically anded with the middle bit latch BDL, set the sense node SEN equal to one, set the sense node SEN to equal to the sense node SEN logically anded with the trip latch SDL, set the trip latch SDL equal to logically not the sense node SEN logically anded with the middle bit latch BDL, set the sense node SEN equal to one, set the sense node SEN equal to the sense node SEN logically anded with the trip latch SDL, set the trip latch SDL equal to not the sense node SEN, and set the cache XDL equal to the trip latch SDL in the middle page read. In addition, the control means is configured to set the trip latch SDL equal to logically not the lower bit latch ADL, set the sense node SEN equal to one, set the sense node SEN equal to the sense node SEN logically anded with the trip latch SDL, set the trip latch SDL to be logically not the sense node SEN logically anded with the middle bit latch BDL, set the sense node SEN equal to one, set the sense node SEN to equal to the sense node SEN logically anded with the trip latch SDL, set the trip latch SDL equal to logically not the sense node SEN, and set the cache XDL equal to the trip latch SDL in the upper page read. It should be appreciated that the first and second programmed data state groups can comprise memory cells targeted for different data states than indicated above and/or the plurality of data states can be grouped into a different number of data state groups, for example.

The selective pre-charging of the bit lines based on the lower page read information described herein (proposals 1 and 2) have no read time penalty compared to pre-lock out read, because no additional read is needed. In order to estimate a current consumption reduction and with reference back to FIG. 23, for example, it can be assumed that a memory cell is randomly distributed, so ⅛ of a total number of the cells in each of the plurality of data states. On-cells conduct current $l_0$. Then for the current approach, LP (5/8 $l_0$+1/8 $l_0$); MP (6/8 $l_0$+4/8 $l_0$+2/8 $l_0$); UP (7/8 $l_0$+3/8 $l_0$). So, the average current is ((5/8 $l_0$+1/8 $l_0$)+(6/8 $l_0$+4/8 $l_0$+2/8 $l_0$)+(7/8 $l_0$+3/8 $l_0$))/7=0.5 $l_0$. When using another selective pre-charging of the bit lines based on the lower page read information (indicated as proposal 2), LP (5/8 $l_0$+1/8 $l_0$); MP (1/8 $l_0$+3/8 $l_0$+1/8 $l_0$); UP (2/8 $l_0$+2/8 $l_0$). Thus, the average current is ((5/8 $l_0$+1/8 $l_0$)+(1/8 $l_0$+3/8 $l_0$+1/8 $l_0$)+(2/8 $l_0$+2/8 $l_0$))/7=0.267 $l_0$. This estimation treats all the memory cells as conducting same current, however Er cell conducts more current than A data state memory cells when the bit line and VCG are the same, so, the current saving may be even larger than estimated.

The selective pre-charging of the bit lines based on the lower page read information described herein (proposals 1 and 2) have been discussed above using eight data states (3 bits per memory cell, or triple level cell (TLC)). Nevertheless, it should be understood that such selective pre-charging of the bit lines based on the lower page information is also suitable for quad level cells (4 bits per memory cell). FIG. 28 shows 3-4-4-4 coding for the data states and pages of QLC memory cells. As shown, LP information can be used to select bit lines to be open or pre-charged in the later MP/IP/TP read to save read current consumption.

FIG. 29 illustrates steps of a method of operating a memory apparatus. As discussed above, the memory apparatus (e.g., memory device 100 of FIG. 1) includes memory cells (e.g., memory cell 10 of FIG. 2) each connected to one of a plurality of word lines (e.g., WL0-WL31 of FIG. 6) and disposed in memory holes (e.g., NAND chain 50 of FIG. 6) each connected to one of a plurality of bit lines (e.g., coupled bit line 36 of FIG. 6). The memory cells are configured to retain a threshold voltage Vth or Vt corresponding to one of a plurality of data states (see e.g., FIG. 4 or FIG. 9). The method includes the step of 2900 applying a bit line voltage to the plurality of bit lines while reading the memory cells to determine whether the memory cells have the threshold voltage above one or more of a plurality of read levels associated with each of the plurality of data states in a first portion of a read operation. The method continues with the step of 2902 grouping the memory cells targeted for ones of the plurality of data states into a plurality of data state groups based on the first portion of the read operation. The method also includes the step of 2904 supplying a near zero voltage to the plurality of bit lines coupled to the memory cells targeted for ones of the plurality of data states associated with at least one of the plurality of data state groups while reading the memory cells targeted for one or more of the plurality of data states in subsequent portions of the read operation. According to an aspect, the read operation is a reverse order read.

Again, as discussed above, the memory cells can comprise a plurality of pages each storing a plurality of bits of data stored in the memory apparatus. The plurality of bits can include a lower bit associated with a lower page of the plurality of pages (e.g., lower bit indicated in FIG. 4 or 9). The one or more of the plurality of read levels associated with each of the plurality of data states in the first portion of the read operation can include the plurality of read levels corresponding to the plurality of data states used to discern the lower bit of each of the memory cells (e.g., memory cells targeted for the Er/E/F/G data states). Therefore, according to an aspect, the method can further includes the step of reading the memory cells to determine whether the memory cells have the threshold voltage above the plurality of read levels corresponding to the plurality of data states used to discern the lower bit of each of the memory cells in the first portion of the read operation. The method can also include the step of reading the memory cells to determine whether the memory cells have the threshold voltage above the plurality of read levels corresponding to the plurality of data states used to discern the plurality of bits of the data of each of the memory cells other than the lower bit in the subsequent portions of the read operation.

As above, with reference back to FIGS. 4 and 9, the plurality of data states may include, in order of the threshold voltage increasing in magnitude, an erased state, a plurality of programmed data states (e.g., A-G data states). As discussed, the memory apparatus can further include a plurality of data state latches including a lower bit latch ADL (e.g., ADL or data state latches 328 of FIG. 5B) configured to store the lower bit for the lower page of the data. Thus, the method further includes the step of grouping the memory cells targeted for ones of the plurality of data states into the plurality of data state groups (e.g., memory cells targeted for the Er/E/F/G data states (ADL=1) and memory cells targeted for the A/B/C/D data states (ADL=0)) based on the lower bit latch ADL. Next, applying the bit line voltage to the plurality of bit lines coupled to the memory cells targeted for each of the plurality of data states corresponding to the lower bit latch ADL storing a zero while reading the memory cells targeted for each of the plurality of data states corresponding to the lower bit latch ADL storing a zero in the subsequent portions of the read operation. The method may also include the step of supplying the near zero voltage to the plurality of bit lines coupled to the memory cells targeted for each of the plurality of data states corresponding to the lower bit latch ADL storing a one while reading the memory cells targeted for each of the plurality of data states corresponding to the lower bit latch ADL storing a one in the subsequent portions of the read operation.

Again, as discussed, the plurality of bits can further include a middle bit associated with a middle page of the plurality of pages (e.g., middle bit indicated in FIG. 4 or 9) and an upper bit associated with an upper page of the plurality of pages (e.g., upper bit indicated in FIG. 4 or 9). Referring back to FIG. 5B for example, the plurality of data state latches includes a trip latch SDL (e.g., SDL of FIG. 5B) coupled to the plurality of data state latches (e.g., data state latches 328) and a voltage clamp (e.g., voltage clamp 321) configured to set the bit line voltage at a sense node SEN (e.g., sense node 342) and a cache XDL (e.g., cache 372, 375 of FIG. 5C) configured to store one bit of the data from the control means. Again, the first portion of the read operation includes a lower page read to determine the lower bit of the memory cells. The subsequent portions of the read operation can include a middle page read to determine the middle bit of the memory cells and an upper page read to determine the upper bit of the memory cells.

The method may further include steps associated with the levels or contents of the cache XDL, lower bit latch ADL, trip latch SDL, sense node SEN for each of the plurality of data states for LP, MP, and UP reads for both the current reverse order read (without the selective pre-charging as described above, indicated as current) and using selective pre-charging of the bit lines based on the lower page read information (indicated as proposal 1) shown in FIGS. 17-21. Specifically, the method may include the steps of setting the trip latch SDL equal to one, setting the sense node SEN equal to one, setting the sense node SEN equal to the sense node SEN logically anded with the trip latch SDL, setting the trip latch SDL to be logically not the sense node SEN logically anded with the trip latch SDL, setting the sense node SEN equal to one, setting the sense node SEN to equal to the sense node SEN logically anded with the trip latch SDL, setting the trip latch SDL equal to logically not the sense node SEN, and setting the cache XDL equal to the trip latch SDL in the lower page read. The method can further include the steps of setting the trip latch SDL equal to the lower bit latch ADL, setting the sense node SEN equal to one, setting the sense node SEN equal to the sense node SEN logically anded with the trip latch SDL, setting the trip latch SDL to be logically not the sense node SEN logically anded with the trip latch SDL, setting the sense node SEN equal to one, setting the sense node SEN to equal to the sense node SEN logically anded with the trip latch SDL, setting the trip latch SDL equal to logically not the sense node SEN, setting the sense node SEN equal to one, set the sense node SEN equal to the sense node SEN logically anded with the trip latch SDL, setting the trip latch SDL equal to not the sense node SEN, and setting the cache XDL equal to the trip latch SDL in the middle page read. The method can additionally include the steps of setting the trip latch SDL equal to the lower bit latch ADL, setting the sense node SEN equal to one, setting the sense node SEN equal to the sense node SEN logically anded with the trip latch SDL, setting the trip latch SDL to be logically not the sense node SEN logically anded with the trip latch SDL, setting the sense node SEN equal to one, setting the sense node SEN to equal to the sense node SEN logically anded with the trip latch SDL, setting the trip latch SDL equal to logically not the sense node SEN, and setting the cache XDL equal to the trip latch SDL in the upper page read.

Again, referring back to FIGS. 4 and 9, the plurality of data states may include, in order of the threshold voltage increasing in magnitude, an erased state, a plurality of programmed data states (e.g., A-G data states). According to an aspect, the plurality of data states can be grouped into a plurality of data state groups including, in order of the threshold voltage increasing in magnitude, an erased data state group and a first programmed data state group and a second programmed data state group. According to an aspect, the erased data state group comprises the erased state, the first programmed data state group includes the memory cells targeted for the A/B/C/D data states, the second programmed data state group includes the memory cells targeted for the E/F/G data states. Thus, the method can further include the step of grouping the memory cells targeted for ones of the plurality of data states into the plurality of data state groups based on relative magnitudes of the threshold voltage. The method can also include the step of supplying the near zero voltage to the plurality of bit lines coupled to the memory cells targeted for the erased data state group while reading the memory cells in the subsequent portions of the read operation. Next, applying the bit line voltage to the plurality of bit lines coupled to the memory cells targeted for each of the plurality of data states in the first programmed data state group and the second programmed data state group while reading the memory cells targeted for each of the plurality of data states in the first programmed data state group in the subsequent portions of the read operation. The method may also include supplying the near zero voltage to the plurality of bit lines coupled to the memory cells targeted for each of the plurality of data states in the first programmed data state group while reading the memory cells targeted for each of the plurality of data states in the second programmed data state group in the subsequent portions of the read operation.

As mentioned above, the plurality of bits can further include a middle bit associated with a middle page of the plurality of pages (e.g., middle bit indicated in FIG. 4 or 9) and an upper bit associated with an upper page of the plurality of pages (e.g., upper bit indicated in FIG. 4 or 9). Referring back to FIG. 5B for example, the memory apparatus further includes a plurality of data state latches including the lower bit latch ADL configured to store the lower bit for the lower page of the data, a middle bit latch BDL (e.g., data state latches 328 of FIG. 5B) configured to store the middle bit for the middle page of the data and an upper bit latch CDL (e.g., data state latches 328 of FIG. 5B) configured to store the upper bit for the upper page of the data. The plurality of data state latches includes a trip latch SDL (e.g., SDL of FIG. 5B) coupled to the plurality of data state latches (e.g., data state latches 328) and a voltage clamp (e.g., voltage clamp 321) configured to set the bit line voltage at a sense node SEN (e.g., sense node 342) and a cache XDL (e.g., cache 372, 375 of FIG. 5C) configured to store one bit of the data from the control means. Again, the first portion of the read operation includes a lower page read to determine the lower bit of the memory cells. The subsequent portions of the read operation can include a middle page read to determine the middle bit of the memory cells and an upper page read to determine the upper bit of the memory cells.

The method can further include steps associated with the levels or contents of the cache XDL, lower bit latch ADL, trip latch SDL, sense node SEN for each of the plurality of data states for LP, MP, and UP reads for both the current reverse order read (without the selective pre-charging as described above, indicated as current) and using another selective pre-charging of the bit lines based on the lower page read information (indicated as proposal 2) as shown in FIGS. 24-27. Therefore, the method can further include the steps of setting the trip latch SDL equal to one, setting the sense node SEN equal to one, setting the sense node SEN equal to the sense node SEN logically anded with the trip latch SDL, setting the trip latch SDL to be logically not the sense node SEN logically anded with the trip latch SDL, setting the trip latch SDL equal to one, setting the sense node SEN to equal to the sense node SEN logically anded with the trip latch SDL, setting the trip latch SDL equal to or less than the sense node SEN, and setting the trip latch SDL equal to the lower bit latch ADL logically anded with the sense node SEN in the lower page read. Then, setting the trip latch SDL equal to logically not the lower bit latch ADL, setting the sense node SEN equal to one, setting the sense node SEN equal to the sense node SEN logically anded with the trip latch SDL, setting the trip latch SDL to be logically not the sense node SEN logically anded with the middle bit latch BDL, setting the sense node SEN equal to one, setting the sense node SEN to equal to the sense node SEN logically anded with the trip latch SDL, setting the trip latch SDL equal to logically not the sense node SEN logically anded with the middle bit latch BDL, setting the sense node SEN equal to one, setting the sense node SEN equal to the sense node SEN logically anded with the trip latch SDL, setting the trip latch SDL equal to not the sense node SEN, and setting the cache XDL equal to the trip latch SDL in the middle page read. The method also may include the steps of setting the trip latch SDL equal to logically not the lower bit latch ADL, setting the sense node SEN equal to one, setting the sense node SEN equal to the sense node SEN logically anded with the trip latch SDL, setting the trip latch SDL to be logically not the sense node SEN logically anded with the middle bit latch BDL, setting the sense node SEN equal to one, setting the sense node SEN to equal to the sense node SEN logically anded with the trip latch SDL, setting the trip latch SDL equal to logically not the sense node SEN, and setting the cache XDL equal to the trip latch SDL in the upper page read.

Clearly, changes may be made to what is described and illustrated herein without, however, departing from the scope defined in the accompanying claims. The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A memory apparatus, comprising:
memory cells each connected to one of a plurality of word lines and disposed in memory holes each connected to one of a plurality of bit lines, the memory cells configured to retain a threshold voltage corresponding to one of a plurality of data states; and
a control means coupled to the plurality of word lines and the plurality of bit lines and configured to:
apply a bit line voltage to the plurality of bit lines while reading the memory cells to determine whether the memory cells have the threshold voltage above one or more of a plurality of read levels associated with each of the plurality of data states in a first portion of a read operation,
group the memory cells targeted for ones of the plurality of data states into a plurality of data state groups based on the first portion of the read operation, and
supply a near zero voltage to the plurality of bit lines coupled to the memory cells targeted for ones of the plurality of data states associated with at least one of the plurality of data state groups while reading the memory cells targeted for one or more of the plurality of data states in subsequent portions of the read operation.

2. The memory apparatus as set forth in claim 1, wherein the memory cells comprise a plurality of pages each storing a plurality of bits of data stored in the memory apparatus, the plurality of bits including a lower bit associated with a lower page of the plurality of pages, the one or more of the plurality of read levels associated with each of the plurality of data states in the first portion of the read operation including the plurality of read levels corresponding to the plurality of data states used to discern the lower bit of each of the memory cells, and the control means is further configured to:
read the memory cells to determine whether the memory cells have the threshold voltage above the plurality of read levels corresponding to the plurality of data states used to discern the lower bit of each of the memory cells in the first portion of the read operation; and
read the memory cells to determine whether the memory cells have the threshold voltage above the plurality of read levels corresponding to the plurality of data states used to discern the plurality of bits of the data of each of the memory cells other than the lower bit in the subsequent portions of the read operation.

3. The memory apparatus as set forth in claim 2, wherein the plurality of data states includes, in order of the threshold voltage increasing in magnitude, an erased state, a plurality of programmed data states, the memory apparatus further includes a plurality of data state latches including a lower bit latch configured to store the lower bit for the lower page of the data, and the control means is further configured to:
group the memory cells targeted for ones of the plurality of data states into the plurality of data state groups based on the lower bit latch;
apply the bit line voltage to the plurality of bit lines coupled to the memory cells targeted for each of the plurality of data states corresponding to the lower bit latch storing a zero while reading the memory cells targeted for each of the plurality of data states corresponding to the lower bit latch storing a zero in the subsequent portions of the read operation; and
supply the near zero voltage to the plurality of bit lines coupled to the memory cells targeted for each of the plurality of data states corresponding to the lower bit latch storing a one while reading the memory cells targeted for each of the plurality of data states corresponding to the lower bit latch storing a one in the subsequent portions of the read operation.

4. The memory apparatus as set forth in claim 3, wherein the plurality of bits further includes a middle bit associated with a middle page of the plurality of pages and an upper bit associated with an upper page of the plurality of pages, the plurality of data state latches includes a trip latch coupled to the plurality of data state latches and a voltage clamp configured to set the bit line voltage at a sense node and a cache configured to store one bit of the data from the control means, the first portion of the read operation includes a lower page read to determine the lower bit of the memory cells and the subsequent portions of the read operation include a middle page read to determine the middle bit of the memory cells and an upper page read to determine the upper bit of the memory cells, and the control means is further configured to:

set the trip latch equal to one, set the sense node equal to one, set the sense node equal to the sense node logically anded with the trip latch, set the trip latch to be logically not the sense node logically anded with the trip latch, set the sense node equal to one, set the sense node to equal to the sense node logically anded with the trip latch, set the trip latch equal to logically not the sense node, and set the cache equal to the trip latch in the lower page read;

set the trip latch equal to the lower bit latch, set the sense node equal to one, set the sense node equal to the sense node logically anded with the trip latch, set the trip latch to be logically not the sense node logically anded with the trip latch, set the sense node equal to one, set the sense node to equal to the sense node logically anded with the trip latch, set the trip latch equal to logically not the sense node, set the sense node equal to one, set the sense node equal to the sense node logically anded with the trip latch, set the trip latch equal to not the sense node, and set the cache equal to the trip latch in the middle page read; and set the trip latch equal to the lower bit latch, set the sense node equal to one, set the sense node equal to the sense node logically anded with the trip latch, set the trip latch to be logically not the sense node logically anded with the trip latch, set the sense node equal to one, set the sense node to equal to the sense node logically anded with the trip latch, set the trip latch equal to logically not the sense node, and set the cache equal to the trip latch in the upper page read.

5. The memory apparatus as set forth in claim 2, wherein the plurality of data states includes, in order of the threshold voltage increasing in magnitude, an erased state, a plurality of programmed data states, the plurality of data states grouped into a plurality of data state groups including, in order of the threshold voltage increasing in magnitude, an erased data state group and a first programmed data state group and a second programmed data state group, the erased data state group comprising the erased state, and the control means is further configured to:

group the memory cells targeted for ones of the plurality of data states into the plurality of data state groups based on relative magnitudes of the threshold voltage;

supply the near zero voltage to the plurality of bit lines coupled to the memory cells targeted for the erased data state group while reading the memory cells in the subsequent portions of the read operation;

apply the bit line voltage to the plurality of bit lines coupled to the memory cells targeted for each of the plurality of data states in the first programmed data state group and the second programmed data state group while reading the memory cells targeted for each of the plurality of data states in the first programmed data state group in the subsequent portions of the read operation; and supply the near zero voltage to the plurality of bit lines coupled to the memory cells targeted for each of the plurality of data states in the first programmed data state group while reading the memory cells targeted for each of the plurality of data states in the second programmed data state group in the subsequent portions of the read operation.

6. The memory apparatus as set forth in claim 5, wherein the plurality of bits further includes a middle bit associated with a middle page of the plurality of pages and an upper bit associated with an upper page of the plurality of pages, the memory apparatus further includes a plurality of data state latches including a lower bit latch configured to store the lower bit for the lower page of the data and a middle bit latch configured to store the middle bit for the middle page of the data and an upper bit latch configured to store the upper bit for the upper page of the data and a trip latch coupled to the plurality of data state latches and a voltage clamp configured to set the bit line voltage at a sense node and a cache configured to store one bit of the data from the control means, the first portion of the read operation includes a lower page read to determine the lower bit of the memory cells and the subsequent portions of the read operation include a middle page read to determine the middle bit of the memory cells and an upper page read to determine the upper bit of the memory cells, and the control means is further configured to:

set the trip latch equal to one, set the sense node equal to one, set the sense node equal to the sense node logically anded with the trip latch, set the trip latch to be logically not the sense node logically anded with the trip latch, set the trip latch equal to one, set the sense node to equal to the sense node logically anded with the trip latch, set the trip latch equal to or less than the sense node, and set the trip latch equal to the lower bit latch logically anded with the sense node in the lower page read;

set the trip latch equal to logically not the lower bit latch, set the sense node equal to one, set the sense node equal to the sense node logically anded with the trip latch, set the trip latch to be logically not the sense node logically anded with the middle bit latch, set the sense node equal to one, set the sense node to equal to the sense node logically anded with the trip latch, set the trip latch equal to logically not the sense node logically anded with the middle bit latch, set the sense node equal to one, set the sense node equal to the sense node logically anded with the trip latch, set the trip latch equal to not the sense node, and set the cache equal to the trip latch in the middle page read; and set the trip latch equal to logically not the lower bit latch, set the sense node equal to one, set the sense node equal to the sense node logically anded with the trip latch, set the trip latch to be logically not the sense node logically anded with the middle bit latch, set the sense node equal to one, set the sense node to equal to the sense node logically anded with the trip latch, set the trip latch equal to logically not the sense node, and set the cache equal to the trip latch in the upper page read.

7. The memory apparatus as set forth in claim 1, wherein the read operation is a reverse order read.

8. A controller in communication with a memory apparatus including memory cells each connected to one of a plurality of word lines and disposed in memory holes each connected to one of a plurality of bit lines, the memory cells configured to retain a threshold voltage corresponding to one of a plurality of data states, the controller configured to:

instruct the memory apparatus to apply a bit line voltage to the plurality of bit lines while reading the memory cells to determine whether the memory cells have the threshold voltage above one or more of a plurality of read levels associated with each of the plurality of data states in a first portion of a read operation;

group the memory cells targeted for ones of the plurality of data states into a plurality of data state groups based on the first portion of the read operation; and instruct the memory apparatus to supply a near zero voltage to the plurality of bit lines coupled to the memory cells targeted for ones of the plurality of data states associated with at least one of the plurality of data state groups while reading the memory cells targeted for one or more of the plurality of data states in subsequent portions of the read operation.

9. The controller as set forth in claim 8, wherein the memory cells comprise a plurality of pages each storing a plurality of bits of data stored in the memory apparatus, the plurality of bits including a lower bit associated with a lower page of the plurality of pages, the one or more of the plurality of read levels associated with each of the plurality of data states in the first portion of the read operation including the plurality of read levels corresponding to the plurality of data states used to discern the lower bit of each of the memory cells, and the controller is further configured to:

instruct the memory apparatus to read the memory cells to determine whether the memory cells have the threshold voltage above the plurality of read levels corresponding to the plurality of data states used to discern the lower bit of each of the memory cells in the first portion of the read operation; and instruct the memory apparatus to read the memory cells to determine whether the memory cells have the threshold voltage above the plurality of read levels corresponding to the plurality of data states used to discern the plurality of bits of the data of each of the memory cells other than the lower bit in the subsequent portions of the read operation.

10. The controller as set forth in claim 9, wherein the plurality of data states includes, in order of the threshold voltage increasing in magnitude, an erased state, a plurality of programmed data states, the memory apparatus further includes a plurality of data state latches including a lower bit latch configured to store the lower bit for the lower page of the data, and the controller is further configured to:

group the memory cells targeted for ones of the plurality of data states into the plurality of data state groups based on the lower bit latch;

instruct the memory apparatus to apply the bit line voltage to the plurality of bit lines coupled to the memory cells targeted for each of the plurality of data states corresponding to the lower bit latch storing a zero while reading the memory cells targeted for each of the plurality of data states corresponding to the lower bit latch storing a zero in the subsequent portions of the read operation; and instruct the memory apparatus to supply the near zero voltage to the plurality of bit lines coupled to the memory cells targeted for each of the plurality of data states corresponding to the lower bit latch storing a one while reading the memory cells targeted for each of the plurality of data states corresponding to the lower bit latch storing a one in the subsequent portions of the read operation.

11. The controller as set forth in claim 10, wherein the plurality of bits further includes a middle bit associated with a middle page of the plurality of pages and an upper bit associated with an upper page of the plurality of pages, the plurality of data state latches includes a trip latch coupled to the plurality of data state latches and a voltage clamp configured to set the bit line voltage at a sense node and a cache configured to store one bit of the data from the controller, the first portion of the read operation includes a lower page read to determine the lower bit of the memory cells and the subsequent portions of the read operation include a middle page read to determine the middle bit of the memory cells and an upper page read to determine the upper bit of the memory cells, and the controller is further configured to:

instruct the memory apparatus to set the trip latch equal to one, set the sense node equal to one, set the sense node equal to the sense node logically anded with the trip latch, set the trip latch to be logically not the sense node logically anded with the trip latch, set the sense node equal to one, set the sense node to equal to the sense node logically anded with the trip latch, set the trip latch equal to logically not the sense node, and set the cache equal to the trip latch in the lower page read;

instruct the memory apparatus to set the trip latch equal to the lower bit latch, set the sense node equal to one, set the sense node equal to the sense node logically anded with the trip latch, set the trip latch to be logically not the sense node logically anded with the trip latch, set the sense node equal to one, set the sense node to equal to the sense node logically anded with the trip latch, set the trip latch equal to logically not the sense node, set the sense node equal to one, set the sense node equal to the sense node logically anded with the trip latch, set the trip latch equal to not the sense node, and set the cache equal to the trip latch in the middle page read; and instruct the memory apparatus to set the trip latch equal to the lower bit latch, set the sense node equal to one, set the sense node equal to the sense node logically anded with the trip latch, set the trip latch to be logically not the sense node logically anded with the trip latch, set the sense node equal to one, set the sense node to equal to the sense node logically anded with the trip latch, set the trip latch equal to logically not the sense node, and set the cache equal to the trip latch in the upper page read.

12. The controller as set forth in claim 9, wherein the plurality of data states includes, in order of the threshold voltage increasing in magnitude, an erased state, a plurality of programmed data states, the plurality of data states grouped into a plurality of data state groups including, in order of the threshold voltage increasing in magnitude, an erased data state group and a first programmed data state group and a second programmed data state group, the erased data state group comprising the erased state, and the controller is further configured to:

group the memory cells targeted for ones of the plurality of data states into the plurality of data state groups based on relative magnitudes of the threshold voltage;

instruct the memory apparatus to supply the near zero voltage to the plurality of bit lines coupled to the memory cells targeted for the erased data state group while reading the memory cells in the subsequent portions of the read operation;

instruct the memory apparatus to apply the bit line voltage to the plurality of bit lines coupled to the memory cells targeted for each of the plurality of data states in the first programmed data state group and the second programmed data state group while reading the memory cells targeted for each of the plurality of data states in the first programmed data state group in the subsequent portions of the read operation; and instruct the memory apparatus to supply the near zero voltage to the plurality of bit lines coupled to the memory cells targeted for each of the plurality of data states in the first programmed data state group while reading the memory cells targeted for each of the plurality of data states in the second programmed data state group in the subsequent portions of the read operation.

13. The controller as set forth in claim 12, wherein the plurality of bits further includes a middle bit associated with a middle page of the plurality of pages and an upper bit associated with an upper page of the plurality of pages, the memory apparatus further includes a plurality of data state latches including a lower bit latch configured to store the lower bit for the lower page of the data and a middle bit latch configured to store the middle bit for the middle page of the data and an upper bit latch configured to store the upper bit for the upper page of the data and a trip latch coupled to the plurality of data state latches and a voltage clamp configured to set the bit line voltage at a sense node and a cache configured to store one bit of the data from the controller, the first portion of the read operation includes a lower page read to determine the lower bit of the memory cells and the subsequent portions of the read operation include a middle page read to determine the middle bit of the memory cells and an upper page read to determine the upper bit of the memory cells, and the controller is further configured to:
   instruct the memory apparatus to set the trip latch equal to one, set the sense node equal to one, set the sense node equal to the sense node logically anded with the trip latch, set the trip latch to be logically not the sense node logically anded with the trip latch, set the trip latch equal to one, set the sense node to equal to the sense node logically anded with the trip latch, set the trip latch equal to or less than the sense node, and set the trip latch equal to the lower bit latch logically anded with the sense node in the lower page read;
   instruct the memory apparatus to set the trip latch equal to logically not the lower bit latch, set the sense node equal to one, set the sense node equal to the sense node logically anded with the trip latch, set the trip latch to be logically not the sense node logically anded with the middle bit latch, set the sense node equal to one, set the sense node to equal to the sense node logically anded with the trip latch, set the trip latch equal to logically not the sense node logically anded with the middle bit latch, set the sense node equal to one, set the sense node equal to the sense node logically anded with the trip latch, set the trip latch equal to not the sense node, and set the cache equal to the trip latch in the middle page read; and
   instruct the memory apparatus to set the trip latch equal to logically not the lower bit latch, set the sense node equal to one, set the sense node equal to the sense node logically anded with the trip latch, set the trip latch to be logically not the sense node logically anded with the middle bit latch, set the sense node equal to one, set the sense node to equal to the sense node logically anded with the trip latch, set the trip latch equal to logically not the sense node, and set the cache equal to the trip latch in the upper page read.

14. A method of operating a memory apparatus including memory cells each connected to one of a plurality of word lines and disposed in memory holes each connected to one of a plurality of bit lines, the memory cells configured to retain a threshold voltage corresponding to one of a plurality of data states, the method comprising the steps of:
   applying a bit line voltage to the plurality of bit lines while reading the memory cells to determine whether the memory cells have the threshold voltage above one or more of a plurality of read levels associated with each of the plurality of data states in a first portion of a read operation;
   grouping the memory cells targeted for ones of the plurality of data states into a plurality of data state groups based on the first portion of the read operation; and
   supplying a near zero voltage to the plurality of bit lines coupled to the memory cells targeted for ones of the plurality of data states associated with at least one of the plurality of data state groups while reading the memory cells targeted for one or more of the plurality of data states in subsequent portions of the read operation.

15. The method as set forth in claim 14, wherein the memory cells comprise a plurality of pages each storing a plurality of bits of data stored in the memory apparatus, the plurality of bits including a lower bit associated with a lower page of the plurality of pages, the one or more of the plurality of read levels associated with each of the plurality of data states in the first portion of the read operation including the plurality of read levels corresponding to the plurality of data states used to discern the lower bit of each of the memory cells, and the method further includes the steps of:
   reading the memory cells to determine whether the memory cells have the threshold voltage above the plurality of read levels corresponding to the plurality of data states used to discern the lower bit of each of the memory cells in the first portion of the read operation; and
   reading the memory cells to determine whether the memory cells have the threshold voltage above the plurality of read levels corresponding to the plurality of data states used to discern the plurality of bits of the data of each of the memory cells other than the lower bit in the subsequent portions of the read operation.

16. The method as set forth in claim 15, wherein the plurality of data states includes, in order of the threshold voltage increasing in magnitude, an erased state, a plurality of programmed data states, the memory apparatus further includes a plurality of data state latches including a lower bit latch configured to store the lower bit for the lower page of the data, and the method further includes the steps of:
   grouping the memory cells targeted for ones of the plurality of data states into the plurality of data state groups based on the lower bit latch;
   applying the bit line voltage to the plurality of bit lines coupled to the memory cells targeted for each of the plurality of data states corresponding to the lower bit latch storing a zero while reading the memory cells targeted for each of the plurality of data states corresponding to the lower bit latch storing a zero in the subsequent portions of the read operation; and
   supplying the near zero voltage to the plurality of bit lines coupled to the memory cells targeted for each of the plurality of data states corresponding to the lower bit latch storing a one while reading the memory cells targeted for each of the plurality of data states corresponding to the lower bit latch storing a one in the subsequent portions of the read operation.

17. The method as set forth in claim 16, wherein the plurality of bits further includes a middle bit associated with a middle page of the plurality of pages and an upper bit associated with an upper page of the plurality of pages, the plurality of data state latches includes a trip latch coupled to the plurality of data state latches and a voltage clamp configured to set the bit line voltage at a sense node and a cache configured to store one bit of the data, the first portion of the read operation includes a lower page read to determine the lower bit of the memory cells and the subsequent portions of the read operation include a middle page read to determine the middle bit of the memory cells and an upper page read to determine the upper bit of the memory cells, and the method further includes the steps of:

setting the trip latch equal to one, setting the sense node equal to one, setting the sense node equal to the sense node logically anded with the trip latch, setting the trip latch to be logically not the sense node logically anded with the trip latch, setting the sense node equal to one, setting the sense node to equal to the sense node logically anded with the trip latch, setting the trip latch equal to logically not the sense node, and setting the cache equal to the trip latch in the lower page read;

setting the trip latch equal to the lower bit latch, setting the sense node equal to one, setting the sense node equal to the sense node logically anded with the trip latch, setting the trip latch to be logically not the sense node logically anded with the trip latch, setting the sense node equal to one, setting the sense node to equal to the sense node logically anded with the trip latch, setting the trip latch equal to logically not the sense node, setting the sense node equal to one, set the sense node equal to the sense node logically anded with the trip latch, setting the trip latch equal to not the sense node, and setting the cache equal to the trip latch in the middle page read; and setting the trip latch equal to the lower bit latch, setting the sense node equal to one, setting the sense node equal to the sense node logically anded with the trip latch, setting the trip latch to be logically not the sense node logically anded with the trip latch, setting the sense node equal to one, setting the sense node to equal to the sense node logically anded with the trip latch, setting the trip latch equal to logically not the sense node, and setting the cache equal to the trip latch in the upper page read.

18. The method as set forth in claim 15, wherein the plurality of data states includes, in order of the threshold voltage increasing in magnitude, an erased state, a plurality of programmed data states, the plurality of data states grouped into a plurality of data state groups including, in order of the threshold voltage increasing in magnitude, an erased data state group and a first programmed data state group and a second programmed data state group, the erased data state group comprising the erased state, and the method further includes the steps of:

grouping the memory cells targeted for ones of the plurality of data states into the plurality of data state groups based on relative magnitudes of the threshold voltage;

supplying the near zero voltage to the plurality of bit lines coupled to the memory cells targeted for the erased data state group while reading the memory cells in the subsequent portions of the read operation;

applying the bit line voltage to the plurality of bit lines coupled to the memory cells targeted for each of the plurality of data states in the first programmed data state group and the second programmed data state group while reading the memory cells targeted for each of the plurality of data states in the first programmed data state group in the subsequent portions of the read operation; and supplying the near zero voltage to the plurality of bit lines coupled to the memory cells targeted for each of the plurality of data states in the first programmed data state group while reading the memory cells targeted for each of the plurality of data states in the second programmed data state group in the subsequent portions of the read operation.

19. The method as set forth in claim 18, wherein the plurality of bits further includes a middle bit associated with a middle page of the plurality of pages and an upper bit associated with an upper page of the plurality of pages, the memory apparatus further includes a plurality of data state latches including a lower bit latch configured to store the lower bit for the lower page of the data and a middle bit latch configured to store the middle bit for the middle page of the data and an upper bit latch configured to store the upper bit for the upper page of the data and a trip latch coupled to the plurality of data state latches and a voltage clamp configured to set the bit line voltage at a sense node and a cache configured to store one bit of the data, the first portion of the read operation includes a lower page read to determine the lower bit of the memory cells and the subsequent portions of the read operation include a middle page read to determine the middle bit of the memory cells and an upper page read to determine the upper bit of the memory cells, and method further includes the steps of:

setting the trip latch equal to one, setting the sense node equal to one, setting the sense node equal to the sense node logically anded with the trip latch, setting the trip latch to be logically not the sense node logically anded with the trip latch, setting the trip latch equal to one, setting the sense node to equal to the sense node logically anded with the trip latch, setting the trip latch equal to or less than the sense node, and setting the trip latch equal to the lower bit latch logically anded with the sense node in the lower page read;

setting the trip latch equal to logically not the lower bit latch, setting the sense node equal to one, setting the sense node equal to the sense node logically anded with the trip latch, setting the trip latch to be logically not the sense node logically anded with the middle bit latch, setting the sense node equal to one, setting the sense node to equal to the sense node logically anded with the trip latch, setting the trip latch equal to logically not the sense node logically anded with the middle bit latch, setting the sense node equal to one, setting the sense node equal to the sense node logically anded with the trip latch, setting the trip latch equal to not the sense node, and setting the cache equal to the trip latch in the middle page read; and setting the trip latch equal to logically not the lower bit latch, setting the sense node equal to one, setting the sense node equal to the sense node logically anded with the trip latch, setting the trip latch to be logically not the sense node logically anded with the middle bit latch, setting the sense node equal to one, setting the sense node to equal to the sense node logically anded with the trip latch, setting the trip latch equal to logically not the sense node, and setting the cache equal to the trip latch in the upper page read.

20. The method as set forth in claim 14, wherein the read operation is a reverse order read.

* * * * *